(12) United States Patent
Ishida et al.

(10) Patent No.: US 8,035,169 B2
(45) Date of Patent: Oct. 11, 2011

(54) SEMICONDUCTOR DEVICE WITH SUPPRESSED CRYSTAL DEFECTS IN ACTIVE AREAS

(75) Inventors: Hiroshi Ishida, Tokyo (JP); Atsushi Maeda, Tokyo (JP); Minoru Abiko, Tokyo (JP); Takehiko Kijima, Tokyo (JP); Takashi Takeuchi, Tokyo (JP); Shoji Yoshida, Tokyo (JP); Natsuo Yamaguchi, Tokyo (JP); Yasuhiro Kimura, Tokyo (JP); Tetsuya Uchida, Tokyo (JP); Norio Ishitsuka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 242 days.

(21) Appl. No.: 12/262,180

(22) Filed: Oct. 31, 2008

(65) Prior Publication Data

US 2009/0134467 A1    May 28, 2009

(30) Foreign Application Priority Data

Nov. 26, 2007    (JP) ................................ 2007-304183

(51) Int. Cl.
*H01L 27/088* (2006.01)

(52) U.S. Cl. ........ 257/401; 257/240; 257/241; 257/503; 257/E27.099; 356/154

(58) Field of Classification Search .................. 257/401, 257/E27.098, E27.099, 240, 241, 503; 365/154
See application file for complete search history.

(56) References Cited

U.S. PATENT DOCUMENTS

| | | | | |
|---|---|---|---|---|
| 5,396,100 A * | 3/1995 | Yamasaki et al. | ............. | 257/390 |
| 5,972,783 A * | 10/1999 | Arai et al. | ...................... | 438/513 |
| 6,501,138 B1 * | 12/2002 | Karasawa | ..................... | 257/371 |
| 6,635,936 B1 * | 10/2003 | Wuu et al. | ..................... | 257/379 |
| 6,795,332 B2 * | 9/2004 | Yamaoka et al. | ............. | 365/154 |
| 7,738,282 B2 * | 6/2010 | Liaw | .............................. | 365/154 |
| 2007/0007617 A1 | 1/2007 | Nakamura et al. | | |
| 2008/0217705 A1 * | 9/2008 | Hall et al. | ...................... | 257/401 |

FOREIGN PATENT DOCUMENTS

JP    2007-43082 A    2/2007

* cited by examiner

*Primary Examiner* — Wael Fahmy
*Assistant Examiner* — John C Ingham
(74) *Attorney, Agent, or Firm* — Miles & Stockbridge P.C.

(57) ABSTRACT

A technique that makes it possible to suppress a crystal defect produced in an active area and thereby reduce the fraction defective of semiconductor devices is provided. A first embodiment relates to the planar configuration of SRAM. One of the features of the first embodiment is as illustrated in FIG. 4. That is, on the precondition that the active areas in n-channel MISFET formation regions are all configured in the isolated structure: the width of the terminal sections is made larger than the width of the central parts of the active areas. For example, the terminal sections are formed in an L shape.

19 Claims, 19 Drawing Sheets

SEMICONDUCTOR DEVICE WITH SUPPRESSED CRYSTAL DEFECTS IN ACTIVE AREAS

CROSS-REFERENCE TO RELATED APPLICATIONS

The disclosure of Japanese Patent Application No. 2007-304183 filed on Nov. 26, 2007 including the specification, drawings and abstract is incorporated herein by reference in its entirety.

BACKGROUND OF THE INVENTION

The present invention relates to semiconductor devices and techniques for manufacturing the semiconductor devices and in particular to a technique effectively applicable to SRAM (Static Random Access Memory) incorporated in an LCD (Liquid Crystal Display) driver or the like.

Japanese Unexamined Patent Publication No. 2007-43082 (Patent Document 1) discloses a semiconductor device having SRAM in which fluctuation in the characteristics of an MIS transistor caused by stress from an element isolation region is suppressed and a manufacturing method therefor. Specifically, this manufacturing method is such that an isolation insulating film is so formed that an active area of a first access transistor and a substrate contact area are integrated with each other as planarly viewed. A dummy gate electrode is formed over the area of a semiconductor substrate positioned between the active area of the first access transistor and the substrate contact area. This dummy gate electrode is electrically coupled with a p-type impurity region of the substrate contact area.

[Patent Document 1]
Japanese Unexamined Patent Publication No. 2007-43082

SUMMARY OF THE INVENTION

In recent years, LCDs using liquid crystal for a display element have rapidly come into widespread use. The LCD is controlled by a driver for driving LCDs. The LCD driver includes: an I/O circuit (input circuit) for inputting input data; a logic circuit for processing input data inputted by the I/O circuit; SRAM for temporarily storing data processed at the logic circuit; an output circuit for outputting data stored in the SRAM with appropriate timing; and the like. In common LCD drivers, as mentioned above, SRAM is used to store data.

As illustrated in FIG. 27, for example, each memory cell MC of SRAM is comprised of the following six field effect transistors formed in a semiconductor substrate: a pair of drive MISFETs Qd1, Qd2; a pair of load MISFETs Qp1, Qp2; and a pair of transfer MISFETs Qt1, Qt2. At this time, the pair of drive MISFETs Qd1, Qd2 and the pair of transfer MISFETs Qt1, Qt2 are formed of n-channel MISFETs, and the pair of load MISFETs Qp1, Qp2 are formed of p-channel MISFETs.

Specifically, the SRAM is so structured that the following is implemented: the semiconductor substrate is divided into multiple active areas An1, An2, An3, Ap1, Ap2 by an element isolation region STI; the active areas An1, An2, An3, Ap1, Ap2 divided by the element isolation region STI are so disposed that the active areas are aligned and extended in a first direction of the semiconductor substrate; and the active areas An1, An2, An3, Ap1, Ap2 are encircled with the element isolation region STI. In the active areas An1, An2, An3 comprising n-channel MISFETs, a source region and a drain region are formed by implanting an n-type impurity, such as phosphorus and arsenic, in the active areas An1, An2, An3. A gate electrode G is formed over the active areas An1, An2, An3 with a gate insulating film in-between between a source region and a drain region. The gate electrodes G are extended in a second direction intersecting the first direction in which the active areas An1, An2, An3 are extended. As mentioned above, the n-channel MISFETs are formed by the gate electrodes G formed over the active areas An1, An2, An3 and the source regions and drain regions formed in the active areas An1, An2, An3 so that the gate electrodes G are respectively sandwiched. Similarly, the p-channel MISFETs are formed by the gate electrodes G formed over the active areas Ap1, Ap2 and the source regions and drain regions formed in the active areas Ap1, Ap2 so that the gate electrodes G are respectively sandwiched.

In the memory cell MC of the SRAM, for example, a drive MISFET Qd1 and a transfer MISFET Qt1 are formed in one and the same active area An1 by the following: a source region and a drain region formed in the active area An1 and two gate electrodes G. A load MISFET Qp1 is formed by a source region and a drain region formed in the active area Ap1 and a gate electrode G. A load MISFET Qp2 is formed by a source region and a drain region formed in the active area Ap2 and a gate electrode G. Similarly, a drive MISFET Qd2 and a transfer MISFET Qt2 are formed in one and the same active area An2 by a source region and a drain region formed in the active area An2 and gate electrodes G.

As mentioned above, multiple memory cells MC each comprised of six field effect transistors are formed in the SRAM. In addition, substrate potential supply sections Lp1, Lp2 are provided to obtain the potential of the drain regions of the drive transistors Qd1, Qd2 because of the structure of the SRAM. These substrate potential supply sections Lp1, Lp2 are formed of a p-type semiconductor region. Similarly, a substrate potential supply section Ln1 comprised of an n-type semiconductor region is also formed in the semiconductor substrate. The area between the formation region for the memory cell MC and the substrate potential supply sections Lp1, Lp2, Ln1 is an area where it is intrinsically unnecessary to form a gate electrode G. However, to uniformly form gate electrodes G throughout the semiconductor substrate to ensure machining accuracy, dummy electrodes DG are formed at intervals corresponding to the intervals between gate electrodes G.

In the thus configured SRAM, the active area An1 and the substrate potential supply section Lp1 are isolated from each other by an element isolation region STI as illustrated in FIG. 27, for example. A terminal section of the active area An1 is prone to be machined into a tapered shape in the process of active area formation, and stress is prone to be concentratedly applied from an element isolation region STI to this tapered terminal section. Especially, when a structure in which a silicon oxide film is filled in a trench formed in the semiconductor substrate is adopted for the element isolation region STI, stress is applied to the active area An1 by expansion of the silicon oxide film filled in the trench. In recent years, a trench comprising the element isolation region STI has been reduced in size because of the microminiaturization of semiconductor devices. Therefore, stress applied to the active area An1 is further increased. For this reason, a crystal defect is prone to be produced at a terminal section of the active area An1. The growth of this crystal defect progresses along the direction of the extension of the active area An1 and the crystal defect is eventually formed astride a source region and a drain region formed in the active area An1. As a result, a leakage current is produced between the source region and the drain region through this crystal defect and the characteristics of the memory cell MC of the SRAM are thereby degraded. As a result, a problem of the increased fraction defective of SRAMs arises.

As illustrated in the active areas An2, An3, a structure in which the active areas An2, An3 and the substrate potential supply section Lp2 are joined with each other is adopted. That is, the following structure is adopted: a structure in which the active areas An2, An3 are extended to the substrate potential supply section Lp2 and the active areas An2, An3 and the substrate potential supply section Lp2 form an H shape. This H-shaped structure brings an advantage that terminal sections of the active areas An2, An3 are not formed. Adoption of the H-shape structure makes it unnecessary to form a terminal section where stress is concentrated and thus makes it possible to suppress a crystal defect that is otherwise produced in the active areas An2, An3.

For this reason, conventional SRAMs partly adopts the following structure as illustrated in FIG. 27 in addition to, for example a structure in which the active area An1 and the substrate potential supply section Lp1 are isolated from each other: a structure (H-shaped structure) in which the active areas An2, An3 and the substrate potential supply section Lp2 are brought into contact with each other. As a result, it is possible to suppress a crystal defect that is otherwise produced in the active areas An2, An3. As mentioned above, conventional SRAMs adopt a layout in which the following structures are alternately disposed for n-channel MISFET formation regions: a structure in which active areas and substrate potential supply sections are isolated from each other by element an isolation region STI like the active area An1 and the substrate potential supply section Lp1; and an H-shaped structure in which active areas and substrate potential supply sections are brought into contact with each other like the active areas An2, An3 and the substrate potential supply section Lp2. Also in p-channel MISFET formation regions, the following structures are disposed: a structure in which an active area and a substrate potential supply section are isolated from each other like the active area Ap1 and the substrate potential supply section Ln1; and a structure in which an active area and a substrate potential supply section are brought into contact with each other like the active area Ap2 and the substrate potential supply section Ln1.

There is the fact that a crystal defect produced in active areas is more frequently produced in active areas formed in an n-channel MISFET formation region than in active areas formed in a p-channel MISFET formation region. According to the result of review carried out by the present inventors, the background of this fact can be thought as follows. In an n-channel MISFET, an n-type impurity, such as phosphorus (P) and arsenic (As), is implanted in an active area to form a source region or a drain region. In a p-channel MISFET formation region, meanwhile, a p-type impurity, such as boron (B) and boron fluoride ($BF_2$), is implanted in an active area to form a source region or a drain region. When a crystal receives stress at this time, a dislocation is produced in the crystal. When this dislocation grows, a crystal defect is formed. The present inventors found that the threshold value of stress that grows a dislocation differs depending on the type of an impurity implanted in an active area. More specific description will be given. When an n-type impurity, such as phosphorus and arsenic, is implanted in an active area, stress required for the growth of a dislocation is reduced as compared with when a p-type impurity, such as boron and boron fluoride, is implanted in an active area. That is, in an active area implanted with an n-type impurity, a dislocation is grown by smaller stress than in an active area implanted with a p-type impurity. For this reason, a crystal defect is more prone to be produced in an active area where an n-channel MISFET is formed than in an active area where a p-channel MISFET is formed. Therefore, it is apparent that in an n-channel MISFET formation region it is required to suppress a crystal defect produced in an active area.

In n-channel MISFET formation regions, as mentioned above, the following structures are alternately disposed: a structure in which an active area and a substrate potential supply section are isolated from each other by an element isolation region STI like the active area An1 and the substrate potential supply section Lp1; and an H-shaped structure in which active areas and a substrate potential supply section are brought into contact with each other like the active areas An2, An3 and the substrate potential supply section Lp2. A crystal defect is more prone to be produced in an active area of the isolated structure that in an active area of the H-shaped structure. To suppress a crystal defect in an isolated structure, it is a common practice to implant nitrogen in an active area comprised of an n-type semiconductor region. That is, an active area implanted with an n-type impurity, such as phosphorus and arsenic, is additionally implanted with nitrogen. Nitrogen has a function of burying a defect. It is possible to restore any defect, dislocation loop, and the like formed by implanting phosphorus or arsenic in an active area. For this reason, a crystal defect produced in an active area in an n-channel MISFET formation region can be suppressed by implanting nitrogen in the active area. With the isolated structure, especially, a crystal defect produced at a terminal section of an active area is remarkably reduced. It can be thought that this is because nitrogen has a function of restoring crystal defects. In other words, it can be thought that this is because stress required for the growth of a dislocation is increased by implanting nitrogen in an active area as compared with cases where only phosphorus or arsenic is implanted. A crystal defect produced in an active area of the isolated structure can be suppressed as mentioned above.

In an n-channel MISFET formation region, as mentioned above, a crystal defect produced in an active area of the isolated structure can be suppressed. As a result, a crystal defect in an active area of the H-shaped structure has become obvious. More specific description will be given. Before nitrogen is implanted, a crystal defect is far more frequently produced in an active area of the isolated structure than in an active area of the H-shaped structure. Therefore, the suppression of crystal defects produced in active areas of the H-shaped structure is lower in level of importance than the suppression of crystal defects produced in active areas of the isolated structure. However, since it has become possible to suppress crystal defects produced in active areas of the isolated structure by implanting nitrogen, the level of importance of suppressing crystal defects produced in active areas of the H-shaped structure has been relatively increased.

In the H-shaped structure, as illustrated in FIG. 27, the active areas An2, An3 as n-type semiconductor regions and the substrate potential supply section Lp2 as a p-type semiconductor region are joined with each other. With the H-shaped structure, stress is applied to the junctions between the active areas An2, An3 and the substrate potential supply section Lp2 and a defect is prone to be produced there. There is a possibility that a crystal defect produced at a junction grows and is extend to the active areas An2, An3 joined with the substrate potential supply section Lp2. More specific description will be given. With the H-shaped structure, the substrate potential supply section Lp2 and the active areas An2, An3 are joined with each other. Therefore, a crystal defect produced in the substrate potential supply section Lp2

(junction) can reach the active areas An2, An3. If a crystal defect penetrating the active area An2, An3 as mentioned above grows, a leakage current is produced between a source region and a drain region through this crystal defect. As a result, the characteristics of the memory cell MC of the SRAM are degraded and a problem of the increased fraction defective of SRAMs arises. More specific description will be given. With the H-shaped structure in which the active areas An2, An3 and the substrate potential supply section Lp2 are joined with each other, the production of a crystal defect can be reduced more than at terminal sections in the isolated structure before nitrogen is implanted. However, as the result of that it has become possible to suppress the production of a crystal defect at terminal sections in the isolated structure after the implantation of nitrogen, the following takes place: crystal defects caused by the H-shaped structure in which the substrate potential supply section Lp2 and the active areas An2, An3 are joined with each other have become obvious.

An object of the invention is to provide a technique that make is possible to reduce the fraction defective of semiconductor devices by suppressing a crystal defect produced in an active area.

The above and other objects and novel features of the invention will be apparent from the description in this specification and the accompanying drawings.

The following is a brief description of the gist of the representative elements of the invention laid open in this application.

A semiconductor device in a representative embodiment includes an n-channel MISFET formed over a semiconductor substrate and the n-channel MISFET includes: (a) a gate insulating film formed over the semiconductor substrate; (b) a gate electrode formed over the gate insulating film; and (c) a source region and a drain region formed in alignment with the gate electrode. The source region and the drain region are formed by implanting an n-type impurity in an active area of the semiconductor substrate. The active area is extended in a first direction of the semiconductor substrate and the gate electrode is extended in a second direction intersecting the first direction. The active area and the gate electrode have areas intersecting each other on a plane. The width of a terminal section of the active area in the second direction is larger than the width of the central part of the active area in the second direction.

According to the semiconductor device in the above representative embodiment, the following can be implemented: the width of a terminal section of an active area is increased and as a result it is possible to reduce stress concentration on the terminal section of the active area. As a result, it is possible to suppress a crystal defect produced in the active area due to stress concentration and to reduce the fraction defective of semiconductor devices.

A semiconductor device in a representative embodiment includes an n-channel MISFET formed over a semiconductor substrate and the n-channel MISFET includes: (a) a gate insulating film formed over the semiconductor substrate; (b) a gate electrode formed over the gate insulating film; and (c) a source region and a drain region formed in alignment with the gate electrode. The source region and the drain region are formed by implanting a conductivity-type impurity in an active area of the semiconductor substrate. The active area is extended in a first direction of the semiconductor substrate and the gate electrode is extended in a second direction intersecting the first direction. The active area and the gate electrode have areas intersecting each other on a plane. At the time, the semiconductor device has a dummy electrode that is formed in the same layer as the gate electrode is and is extended in the second direction in parallel with the gate electrode. The dummy electrode overlaps with a terminal section of the active area on a plane.

According to the semiconductor device in the above representative embodiment, a terminal section of an active area is covered with a dummy electrode. As a result, an impurity is not implanted in the terminal section of the active area. That is, it is possible to suppress a crystal defect produced by implanting an impurity and to reduce the fraction defective of semiconductor devices.

A method of manufacturing a semiconductor device in a representative embodiment includes the steps of: (a) forming an element isolation region over a semiconductor substrate to divide an active area and a substrate contact section from each other and isolating the active area and the substrate contact section from each other by the element isolation region; and (b) forming a p-type well in the semiconductor substrate. The method includes the steps of: (c) after the steps above, forming a gate insulating film over the semiconductor substrate; (d) forming a conductor film over the gate insulating film; and (e) patterning the conductor film to form a gate electrode over the active area with the gate insulating film in-between. The method includes the steps of: (f) after the steps above, implanting an n-type impurity in the active area in alignment with the gate electrode to form a source region and a drain region comprised of an n-type semiconductor region; and (g) implanting a p-type impurity in the substrate contact section to form a substrate potential supply section. The active area formed at the step of (a) is extended in a first direction of the semiconductor substrate and the gate electrode formed at the step of (e) is extended in a second direction intersecting the first direction. The active area and the gate electrode have areas intersecting each other on a plane. The width of a terminal section of the active area in the second direction is larger than the width of the central part of the active area in the second direction.

According to the method of manufacturing the semiconductor device in the above representative embodiment, the following can be implemented: the width of a terminal section of an active area is increased and as a result it is possible to reduce stress concentration on the terminal section of the active area. As a result, it is possible to suppress a crystal defect produced in the active area due to stress concentration and to reduce the fraction defective of semiconductor devices.

A method of manufacturing a semiconductor device in a representative embodiment includes the steps of: (a) forming an element isolation region over a semiconductor substrate to divide an active area and a substrate contact section from each other and isolating the active area and the substrate contact section from each other by the element isolation region; and (b) forming a p-type well in the semiconductor substrate. The method includes the steps of: (c) after the steps above, forming a gate insulating film over the semiconductor substrate; (d) forming a conductor film over the gate insulating film; and (e) patterning the conductor film to form a gate electrode over the active area with the gate insulating film in-between. The method includes: (f) after the steps above, implanting an n-type impurity in the active area in alignment with the gate electrode to form a source region and a drain region comprised of an n-type semiconductor region; and (g) implanting a p-type impurity in the substrate contact section to form a substrate potential supply section. The active area formed at the step of (a) is extended in a first direction of the semiconductor substrate and the gate electrode formed at the step of (e) is extended in a second direction intersecting the first direction. The active area and the gate electrode have areas intersecting each other on a plane. At the step of (e), a dummy electrode that is positioned in the same layer as the gate electrode is and is extended in the second direction in parallel with the gate electrode. The dummy electrode overlaps with a terminal section of the active area on a plane.

According to the method of manufacturing the semiconductor device in the above representative embodiment, a terminal section of an active area is covered with a dummy electrode. As a result, an impurity is not implanted in the terminal section of the active area. That is, it is possible to suppress a crystal defect produced by implanting an impurity and to reduce the fraction defective of semiconductor devices.

The following is a brief description of the gist of the effect obtained by the representative elements of the invention laid open in this application.

A crystal defect produced in an active area can be suppressed. At a result, it is possible to provide a technique that makes it possible to reduce the fraction defective of semiconductor devices.

BRIEF DESCRIPTION OF THE DRAWINGS

FIG. 23 is an enlarged view illustrating how a semiconductor chip and a glass substrate are coupled with each other with an anisotropic conductive film in-between;

DETAILED DESCRIPTION OF THE PREFERRED EMBODIMENTS

In the following description, each embodiment will be divided into multiple sections or embodiments if necessary for the sake of convenience. Unless explicitly stated otherwise, they are not unrelated to one another, and they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies, and the number may be above or below that specific number.

In the following description of embodiments, needless to add, their constituent elements (including elemental steps and the like) are not always indispensable unless explicitly stated otherwise or they are obviously indispensable in principle.

Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

In every drawing for explaining embodiments of the invention, members having the same function will be marked with the same numerals or codes, and the repetitive description thereof will be omitted. The drawings may be hatched to make them more understandable even though they are plan views.

First Embodiment

In the description of the first embodiment, SRAM used in LCD drivers (semiconductor devices) will be taken as a representative concrete example. However, the invention is also applicable to SRAMs used in semiconductor devices other than LCD drivers. Further, the invention can be applied not only to SRAMs but is widely applicable to semiconductor devices in which a field effect transistor (MISFET (Metal Insulator Semiconductor Field Effect Transistor)) is formed.

Figure 1:
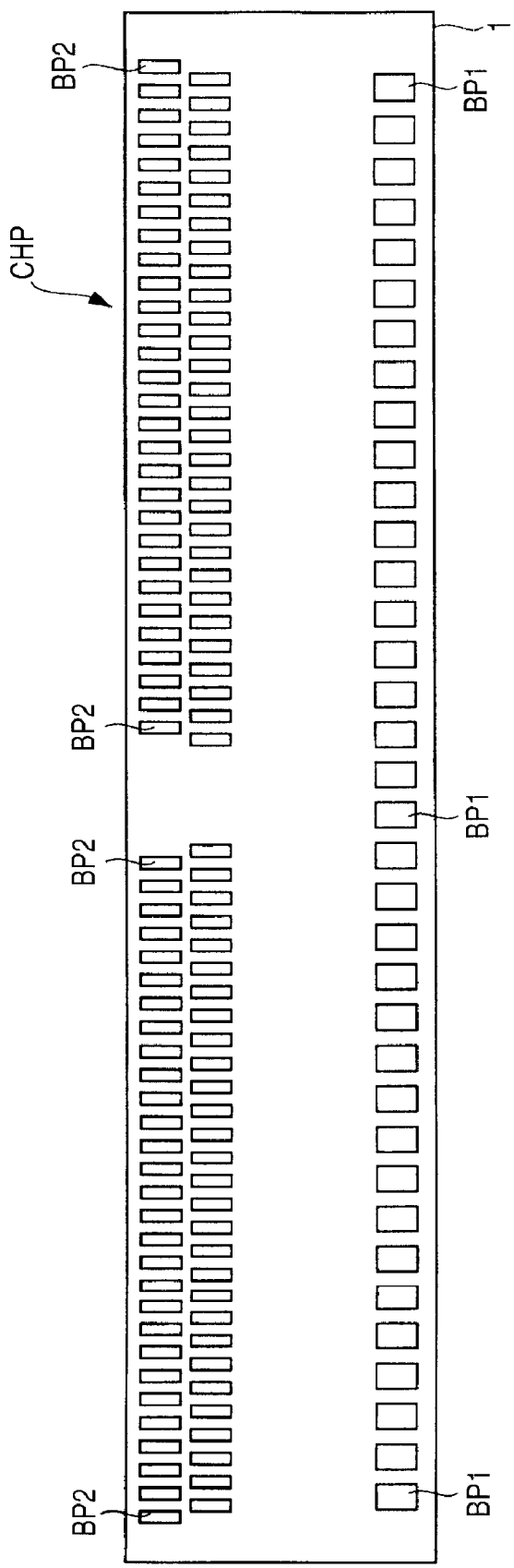
FIG. 1 is an appearance diagram illustrating an LCD driver (semiconductor device) of the invention.

Description will be given to the appearance configuration of an LCD driver in the first embodiment. FIG. 1 is a plan view illustrating the surface of a semiconductor chip CHP comprising an LCD driver. In FIG. 1, the semiconductor chip CHP includes a semiconductor substrate 1 formed in, for example, the shape of an oblong (rectangular shape) and has a LCD driver for driving, for example, a liquid crystal display device formed over the principal surface thereof.

The semiconductor chip CHP is in the shape of an oblong having a pair of short sides and a pair of long sides, and along one of the pair of long sides, there are disposed bump electrodes BP1. (This long side is positioned on the lower side in FIG. 1.) These bump electrodes BP1 are disposed in a straight line. Each bump electrode BP1 has the functions of an external coupling terminal to be coupled with an integrated circuit (LSI (Large Scale Integration)) comprised of semiconductor elements and wirings formed in the semiconductor chip CHP. Especially, the bump electrodes BP1 are used for digital input signals or analog input signals.

Along the other (positioned on the upper side in FIG. 1) of the pair of long sides, there are disposed bump electrodes BP2. These bump electrodes BP2 are disposed in two rows along the long side, and the two rows are disposed in a staggered arrangement along the long side. This arrangement makes it possible to dispose the bump electrodes BP2 in high density. These bump electrodes BP2 also function as external coupling terminals coupling the integrated circuit formed in the semiconductor substrate 1 and the outside. Especially, the bump electrodes BP2 are used for output signals from the integrated circuit.

As mentioned above, the bump electrodes BP1 and the bump electrodes BP2 are formed on the pair of long sides comprising the periphery of the semiconductor chip CHP. Since the number of the bump electrodes BP2 is larger than the number of the bump electrodes BP1, the following measure is taken: the bump electrodes BP2 are disposed in a staggered arrangement along the long side while the bump electrodes BP1 are formed in a straight line along the long side. The reason for this is as follows: while the bump electrodes BP1 are used for input signals inputted to the LCD driver, the bump electrodes BP2 are used for output signals outputted from the LCD driver. More specific description will be given. Since the input signals inputted to the LCD driver are serial data, the number of the bump electrodes BP1 as external coupling terminals is not so large. Since the output signals outputted from the LCD driver are parallel data, meanwhile, the number of the bump electrodes BP2 as external coupling terminals is large. The bump electrodes BP2 for output signals are provided for individual cells (pixels) comprising liquid crystal display elements, and thus bump electrodes BP2 in the number equivalent to the number of cells are required. Therefore, the bump electrodes BP2 for output signals are increased in number as compared with the bump electrodes BP1 for input signals. For this reason, the bump electrodes BP1 for input signals can be disposed in a straight line along the long side and the bump electrodes BP2 for output signals are disposed in a staggered arrangement to increase the number thereof.

In the example illustrated in FIG. 1, the bump electrodes BP1 and the bump electrodes BP2 are disposed along the pair of long sides comprising the semiconductor chip CHP. Further, bump electrodes can also be disposed along the pair of short side in addition to the pair of long sides.

Figure 2:
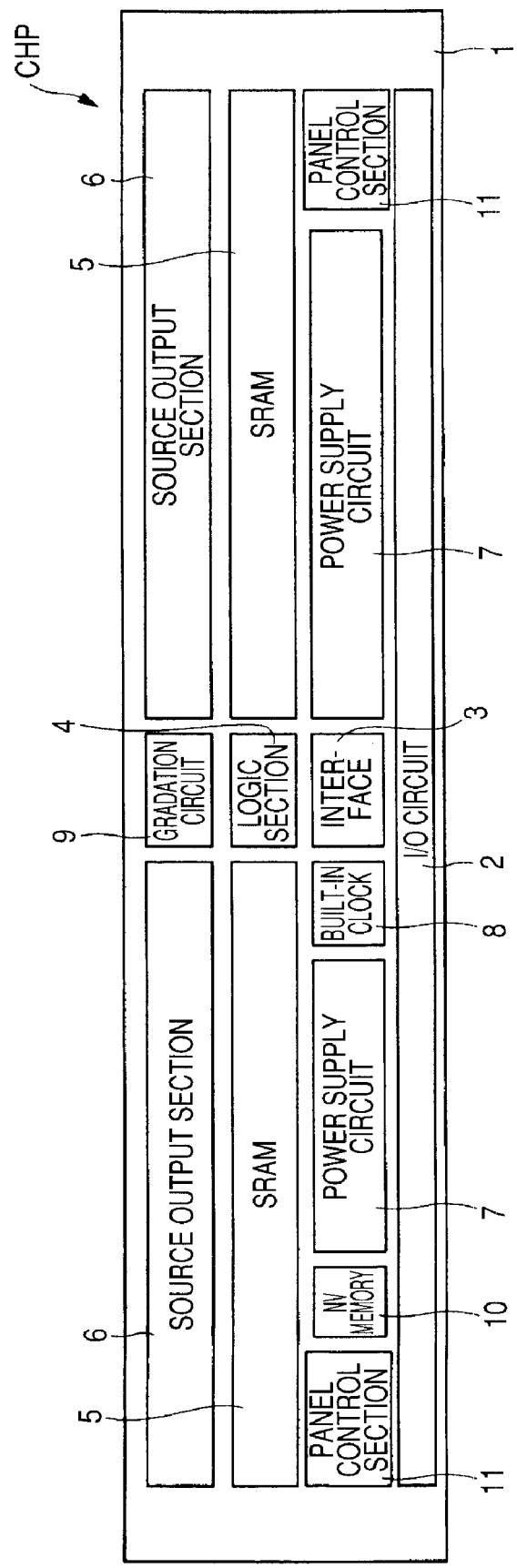
FIG. 2 is a functional block diagram illustrating the functions of an LCD driver.

The appearance configuration of the semiconductor chip CHP is as mentioned above. Hereafter, description will be given to the functions of the LCD driver implemented by the integrated circuit formed in the semiconductor chip CHP. FIG. 2 is a functional block diagram illustrating the functions of the LCD driver. This LCD driver has a function of supplying voltage to each pixel of the cell array comprising the LCD to control the orientation of liquid crystal molecules. As illustrated in FIG. 2, the LCD driver includes an I/O circuit 2, an interface 3, a logic section 4, SRAM 5, a source output section 6, a power supply circuit 7, a built-in clock 8, a gradation circuit 9, an NV memory 10, a panel control section 11, and the like. These functions are implemented by semiconductor elements and wirings formed in the semiconductor substrate 1.

The I/O circuit 2 is used to input signals to the LCD driver (semiconductor chip CHP). The interface 3 is a circuit placed between the I/O circuit 2 and the logic section 4 to output input signals, inputted from the I/O circuit, to the logic section.

The logic section 4 is comprised of a decoder, a shift register, and the like and carries out data processing on input signals inputted to the logic section 4. Specifically, the logic section 4 has a function of converting input signals comprised of serial data into parallel data corresponding to each pixel of the cell array.

The SRAM 5 stores data, for example, parallel data processed at the logic section 4. The source output section 6 has a function of outputting parallel data, generated at the logic section 4 and stored in the SRAM 5, from the LCD driver with predetermined timing. For example, the source output section 6 is comprised of: a latch circuit that is inputted with parallel data stored in the SRAM 5 with predetermined timing and holds the data; a level shift circuit that converts the voltage of parallel data outputted from the latch circuit into voltage signals (output signals) suitable for each pixel of the cell array; and the like.

The power supply circuit 7 is supplied with input voltage from a direct-current power supply and is operated. The power supply circuit generates reference voltage and generates internal voltages having various voltage values from input voltage and supplies these voltages to each part comprising the LCD driver. For example, the power supply circuit 7 supplies an operating voltage of approximately 5V to the logic section 4 and a voltage of approximately 40V to the level shift circuit comprising part of the source output section 6.

The built-in clock 8 is a circuit that generates clock signals used to provide predetermined timing. The clock signals generated by the built-in clock 8 are utilized to control timing with which parallel data is generated from serial data at the logic section 6 and timing with which parallel data stored in the SRAM 5 is sequentially outputted.

The gradation circuit 9 has a function of controlling voltage required to determine the color tone of a liquid crystal display panel (LCD). The NV memory 10 is used to trim reference voltage or write a product code or as a redundant circuit for the SRAM 5. Further, the panel control section 11 is used to control word output.

The LCD driver (semiconductor chip CHP) has the above-mentioned functions. Hereafter, brief description will be given to main operations thereof. First, display data (5V) is inputted from CPU (Central Processing Unit) external to the LCD driver. This display data (5V) is serial data and inputted from a bump electrode BP1 as an external coupling terminal of the LCD driver. The serial data (5V) inputted from the bump electrode BP1 is inputted to the logic circuit 4 through the I/O circuit 2 and the interface 3. At the logic circuit 4, the inputted serial data (5V) is converted into parallel data (5V) corresponding to each pixel of the cell array based on a clock signal generated at the built-in clock 8. This conversion from serial data (5V) to parallel data (5V) is carried out using a decoder or a shift register comprising the logic circuit 4.

Subsequently, the parallel data (5V) generated at the logic circuit 4 is stored in the SRAM 5. The parallel data (5V) stored in the SRAM 5 is read from the SRAM 5 with predetermined timing and outputted to the source output section 6. The parallel data (5V) inputted to the source output section 6 goes through the latch circuit comprising the source output section 6 and then converted into a high-voltage output signal (40V) at the level shift circuit comprising the source output section 6. An output signal (40V) from the level shift circuit is outputted from a bump electrode BP2 as an external coupling terminal of the LCD driver to each pixel of the LCD (liquid crystal display panel). Thus, it is possible to supply voltage to each pixel of the cell array comprising the LCD to control the orientation of liquid crystal molecules, and as a result, an image is displayed on the LCD. The LCD driver functions as mentioned above. In the LCD driver, at this time, the function of storing data is implemented by the SRAM 5, and it turns out that the SRAM 5 has an important function for implementing the LCD driver. The first embodiment is characterized in the structure of the SRAM 5 comprising the LCD driver.

Figure 3:
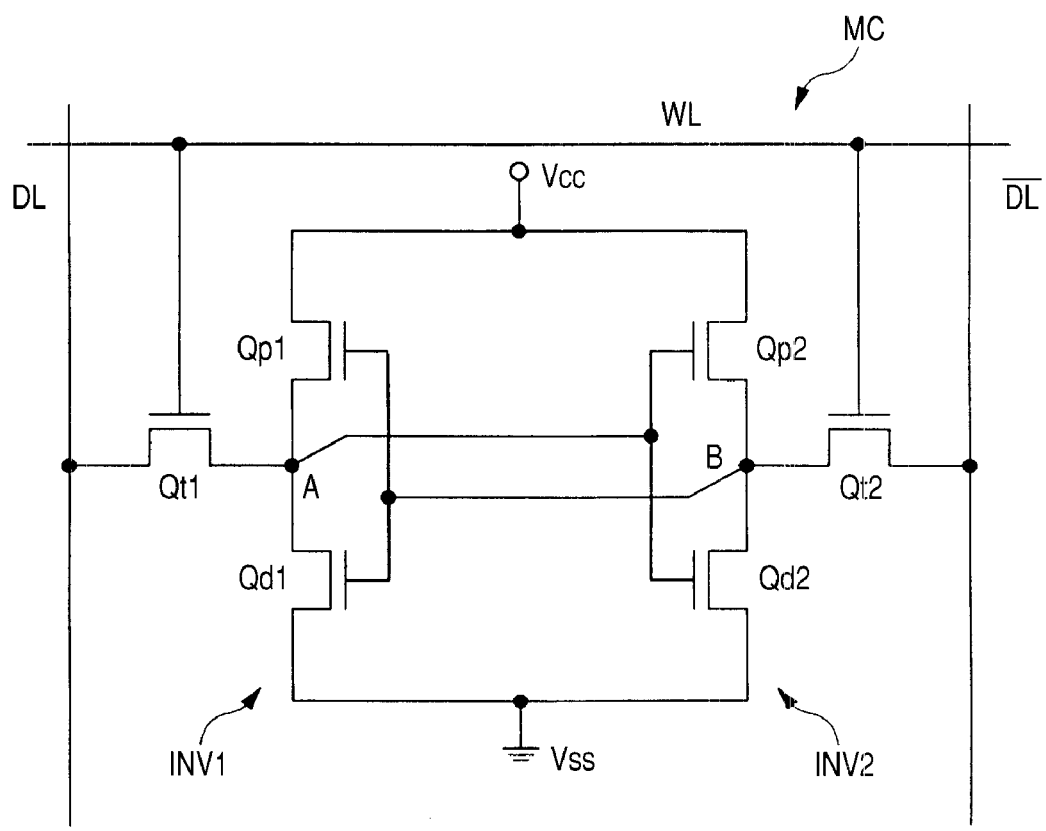
FIG. 3 is a circuit diagram illustrating an equivalent circuit of SRAM.

Hereafter, description will be given to the SRAM 5. First, description will be given to an equivalent circuit of a memory cell MC comprising the SRAM 5. FIG. 3 is an equivalent circuit diagram illustrating a memory cell MC of the SRAM in the first embodiment. As illustrated in FIG. 3, this memory cell MC is disposed at a point of intersection of a pair of complementary data lines (data line DL, data line /DL) and a word line WL and is comprised of: a pair of drive MISFETs Qd1, Qd2, a pair of load MISFETs Qp1, Qp2, and a pair of transfer MISFETs Qt1, Qt2. The drive MISFETs Qd1, Qd2 and the transfer MISFETs Qt1, Qt2 are comprised of n-channel MISFETs and the load MISFETs Qp1, Qp2 are comprised of p-channel MISFETs.

Of the six MISFETs comprising the memory cell MC, the drive MISFET Qd1 and the load MISFET Qp1 form a CMOS inverter INV1 and the drive MISFET Qd2 and the load MISFET Qp2 form a CMOS inverter INV2. The respective input/output terminals (storage nodes A, B) of the pair of CMOS inverters INV1, INV2 are cross-linked with each other and the CMOS inverters form a flip flop circuit as an information storage section for storing one bit of information. One input/output terminal (storage node A) of the flip flop circuit is coupled to either of the source region and drain region of the transfer MISFET Qt1. The other input/output terminal (storage node B) is coupled to either of the source region and drain region of the transfer MISFET Qt2.

The other of the source region and drain region of the transfer MISFET Qt1 is coupled to the data line DL and the other of the source region and drain region of the transfer MISFET Qt2 is coupled to the data line /DL. One end of the flip flop circuit (the respective source regions of the load MISFETs Qp1, Qp2) is coupled to supply voltage (Vcc) and the other end (the respective source regions of the drive MISFETs Qd1, Qd2) is coupled to reference voltage (Vss).

Description will be given to the operation of the above circuit. When the storage node A of one CMOS inverter INV1 is at high potential ("H"), the drive MISFET Qd2 is turned on. Therefore, the storage node B of the other CMOS inverter INV2 is brought to low potential ("L"). As a result, the drive MISFET Qd1 is turned off and the storage node A is kept at high potential ("H"). That is, the states of the respective storage nodes A, B are maintained by the latch circuit obtained by cross-linking the pair of CMOS inverters INV1, INV2 and information is held as long as the supply voltage is applied.

The respective gate electrodes of the transfer MISFETs Qt1, Qt2 are coupled with the word line WL. The energization/non-energization of the transfer MISFETs Qt1, Qt2 is controlled by this word line WL. More specific description will be given. When the word line WL is at high potential ("H"), the transfer MISFETs Qt1, Qt2 are turned on and the latch circuit and the complementary data lines (data lines DL, /DL) are electrically coupled with each other. Therefore, the state ("H" or "L") of potential at the storage nodes A, B appears on the data lines DL, /DL and is read as the information of the memory cell MC.

To write information to the memory cell MC, the word line WL is brought to the "H" potential level and the transfer MISFETs Qt1, Qt2 are turned on. Thus the information on the data lines DL, /DL is transmitted to the storage nodes A, B. The SRAM can be operated as mentioned above.

Figure 4:
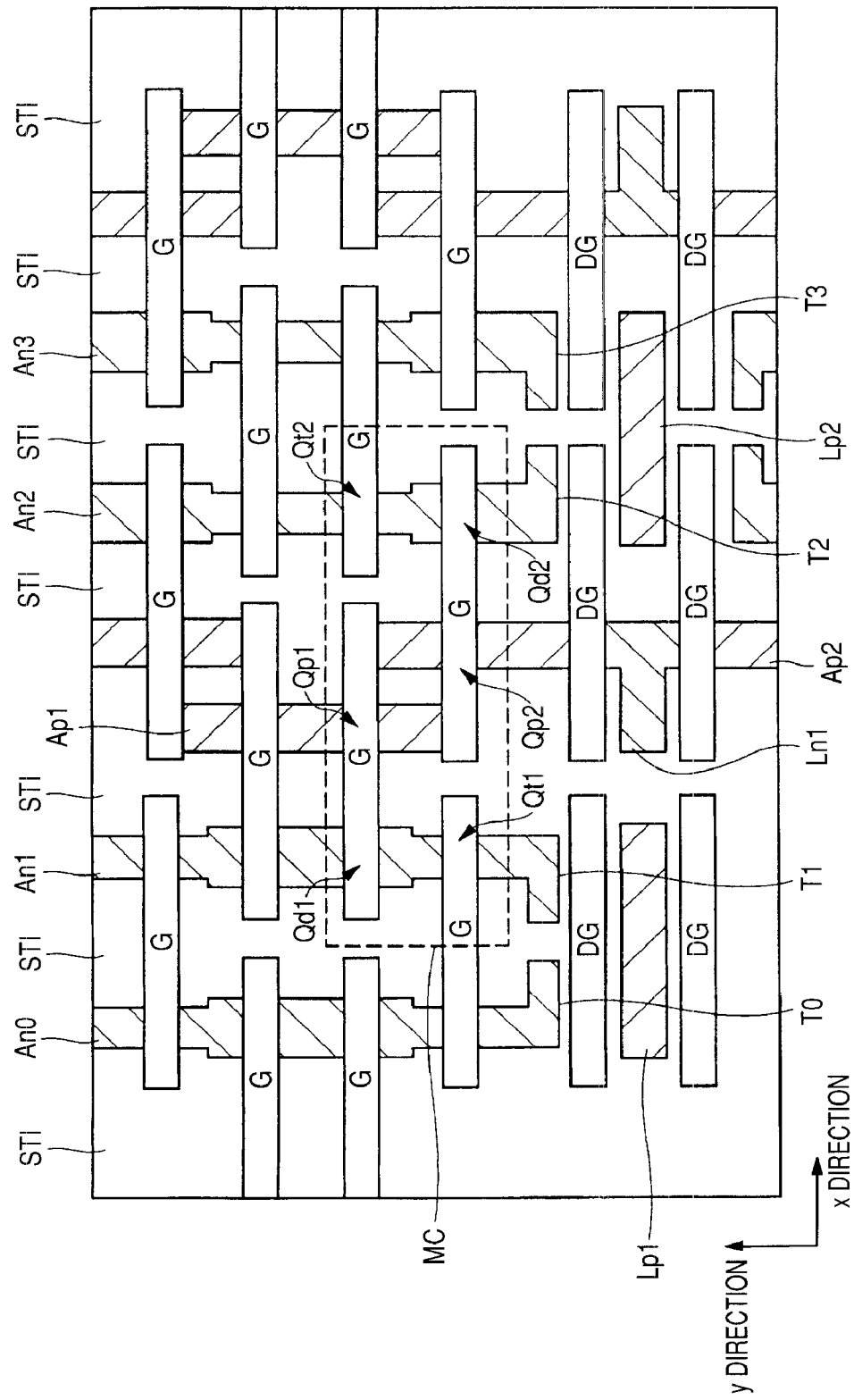
FIG. 4 is a drawing illustrating an example of the planar configuration of SRAM.

Description will be given to layout configuration characteristic of the SRAM in the first embodiment. As illustrated in FIG. 4, for example, a memory cell MC (area encircled with broken line in FIG. 4) of the SRAM is comprised of the following six field effect transistors formed in a semiconductor substrate: a pair of drive MISFETs Qd1, Qd2; a pair of load MISFETs Qp1, Qp2; and a pair of transfer MISFETs Qt1, Qt2. The pair of drive MISFETs Qd1, Qd2 and the pair of transfer MISFETs Qt1, Qt2 are comprised of n-channel MISFETs and the pair of load MISFETs Qp1, Qp2 are comprised of p-channel MISFETs.

Specifically, the semiconductor substrate is divided into multiple active areas An0, An1, An2, An3, Ap1, Ap2 by an element isolation region STI. The active areas An0, An1, An2, An3, Ap1, Ap2 divided by the element isolation region STI are so disposed that the active areas are arranged in the x direction (second direction) of the semiconductor substrate and are extended in the y direction (first direction). The active areas An0, An1, An2, An3, Ap1, Ap2 are so structured that the active areas are encircled with the element isolation region STI. In the active areas An0, An1, An2, An3 comprising n-channel MISFETs, a source region and a drain region are formed by implanting an n-type impurity, such as phosphorus and arsenic, in the active areas An0, An1, An2, An3. Over the active areas An0, An1, An2, An3, there are formed a gate electrode G through a gate insulating film between a source region and a drain region. The gate electrodes G are extended in the x direction (second direction) intersecting the y direction (first direction) in which the active areas An0, An1, An2, An3 are extended. Thus, n-channel MISFETs are formed by the gate electrodes G formed over the active areas An0, An1, An2, An3 and the source regions and drain regions formed in the active areas An0, An1, An2, An3 so that the gate electrodes G are sandwiched. Similarly, p-channel MISFETs are formed by the gate electrodes G formed over the active areas Ap1, Ap2 and the source regions and drain regions formed in the active areas Ap1, Ap2 so that the gate electrodes G are sandwiched.

In the memory cell MC of the SRAM, for example, the MISFETs are formed as follows. The drive MISFET Qd1 and the transfer MISFET Qt1 are formed in one and the same active area An1 by the source region and drain region formed in the active area An1 and two gate electrodes G. The load MISFET Qp1 is formed by the source region and drain region formed in the active area Ap1 and a gate electrode G. The load MISFET Qp2 is formed by the source region and drain region formed in the active area Ap2 and a gate electrode G. Similarly, the drive MISFET Qd2 and the transfer MISFET Qt2 are formed in one and the same active area An2 by the source region and drain region formed in the active area An2 and gate electrodes G.

In the SRAM, as mentioned above, multiple memory cells MC each comprised of six field effect transistors are formed. In the SRAM, aside from the memory cells, substrate potential supply sections Lp1, Lp2 are formed to obtain the potential of the drain regions of the drive transistors Qd1, Qd2 because of the structure of the SRAM. These substrate potential supply sections Lp1, Lp2 are formed of p-type semiconductor regions. In the semiconductor substrate, there is also formed a substrate potential supply section Ln1 comprised of an n-type semiconductor region. In the areas between the formation region for the memory cell MC and the substrate potential supply sections Lp1, Lp2, Ln1, it is intrinsically unnecessary to form a gate electrode G. However, to uniformly form gate electrodes G throughout the semiconductor substrate to ensure machining accuracy, dummy electrodes DG are formed at intervals corresponding to the intervals between gate electrodes G. These dummy electrodes DG are formed in the same layer as the gate electrodes G are.

One of the features of the first embodiment is that the active areas An0, An1, An2, An3 where an n-channel MISFET is formed are all of the isolated structure. In conventional SRAMs, as described in the section of "SUMMARY OF THE INVENTION," the following measure is taken with respect to active areas where an n-channel MISFET is formed: an active area of the isolated structure and an active area of the H-shaped structure are alternately formed. The isolated structure is a structure in which an active area is not joined with a substrate potential supply section, and the H-shaped structure is a structure in which an active area is joined with a substrate potential supply section. When both the isolated structure and the H-shaped structure are used, usually, a crystal defect extended in the direction of extension of active areas is more prone to be produced in active areas of the isolated structure. That is, when an active area is of the isolated structure, a linear crystal defect extended astride a source region and a drain region formed in the active area is prone to be produced. The reason for this is as follows: when an active area is of the isolated structure, a terminal section exists; this terminal section is prone to be machined into a tapered shape in the process of active area formation; and stress is prone to be concentratedly applied from an element isolation region STI to this tapered terminal section. With the H-shaped structure, an active area is joined with a substrate potential supply section and thus a terminal section does not exist. For this reason, it can be said that a crystal defect astride a source region and a drain region is more likely to be suppressed with the H-shaped structure than with the isolated structure.

Consequently, for SRAMs having the isolated structure and the H-shaped structure alternately formed, it is important to suppress a crystal defect in the isolated structure. To suppress a crystal defect in the isolated structure, it is a common practice to implant nitrogen (n-type impurity) in an active area in an n-channel MISFET formation region. That is, active areas implanted with an n-type impurity, such as phosphorus and arsenic, are additionally implanted with nitrogen. Nitrogen has a function of burying a defect. It is possible to restore any detect, dislocation loop, and the like formed by implanting phosphorus or arsenic in an active area. For this reason, a crystal defect produced in an active area in an n-channel MISFET formation region can be suppressed by implanting nitrogen in the active area. A crystal defect developing from a terminal section can be reduced in an active area of the isolated structure in an n-channel MISFET formation region by implanting nitrogen in the active area.

As a result, a crystal defect in the isolated structure can be reduced but a crystal defect produced in the H-shaped structure has become obvious as a new problem. More specific description will be given. The implantation of nitrogen makes it possible to reduce a crystal defect in an isolated structure but a crystal defect in an H-shaped structure newly becomes obvious. It is in cases where the crystal defect is formed astride a source region and a drain region formed in an active area that a crystal defect produced in an H-shaped structure poses a problem. In case of the H-shaped structure, this crystal defect is produced by the mechanism described below. With the H-shaped structure, an active area as an n-type semiconductor region and a substrate potential supply section as a p-type semiconductor region are coupled with each other. With this H-shaped structure, stress is applied to the junction between an active area and a substrate potential supply section and a defect is prone to be produced there. There is a possibility that a crystal defect produced at the junction is extended to the active area joined with the substrate potential supply section. That is, with the H-shaped structure, a substrate potential supply section and an active area are joined with each other; therefore, a crystal defect produced in the substrate potential supply section (junction) can reach the active area.

More specific description will be given. With the H-shaped structure in which an active area and a substrate potential supply section are joined with each other, the production of a crystal defect at terminal sections can be reduced as compared with the isolated structure before nitrogen is implanted. However, as the result of that it has become possible to suppress the production of a crystal defect at terminal sections in the isolated structure after the implantation of nitrogen, the following takes place: crystal defects caused by the H-shaped structure in which a substrate potential supply section and an active area are joined with each other become obvious. That is, the frequency of the production of a crystal defect in the isolated structure and that of the production of a crystal defect in the H-shaped structure are reversed between before and after nitrogen is implanted in an n-type semiconductor region (active area).

Because of the foregoing, in the first embodiment, the active areas An0, An1, An2, An3 in n-channel MISFET formation regions are configured in the isolated structure as illustrated in FIG. 4. Then the active areas An0, An1, An2, An3 of the isolated structure are implanted with nitrogen. As a result, in the active areas An0, An1, An2, An3, it is possible to reduce a crystal defect astride a source region and a drain region.

The structure in which the active areas An0, An1, An2, An3 in n-type semiconductor regions are simply configured in the isolated structure and nitrogen is implanted makes it possible to suppress crystal defects to some degree. However, this structure is not adequate.

In the first embodiment, consequently, the measure illustrated in FIG. 4 is taken. The width of the active areas An0, An1, An2, An3 of the isolated structure is made larger at the respective terminal sections T0, T1, T2, T3 than at the respective parts (central parts) back from the terminal sections T0, T1, T2, T3. In other words, the terminal sections T0, T1, T2, T3 of the active areas An0, An1, An2, An3 are formed in an L shape. With this configuration, it is possible to suppress stress concentration from an element isolation region STI on terminal sections that are prone to be machined into a tapered shape in the process of active area formation. That is, increasing the width of the terminal sections T0, T1, T2, T3 makes it possible to prevent the terminal sections T0, T1, T2, T3 from being machined into a tapered shape when the active areas An0, An1, An2, An3 are machined. More specific description will be given. Increasing the width of the terminal sections T0, T1, T2, T3 makes it possible to disperse stress applied from an element isolation region STI. Therefore, it is possible to reduce stress applied to the terminal sections T0, T1, T2, T3 from element isolation region STI and to suppress the growth of a crystal defect from the terminal sections T0, T1, T2, T3.

As mentioned above, one of the features of the first embodiment is that the following measure is taken on the precondition that the active areas An0, An1, An2, An3 in n-channel MISFET formation regions are all configured in the isolated structure: the width of the terminal sections T0, T1, T2, T3 is made larger than the width of the central parts of the active areas An0, An1, An2, An3. Implanting nitrogen in the active areas An0, An1, An2, An3 in n-channel MISFET formation regions at this time makes it possible to further suppress a crystal defect that is otherwise produced in the active areas An0, An1, An2, An3. That is, in the first preferred embodiment, a crystal defect that is otherwise produced in the active areas An0, An1, An2, An3 can be sufficiently suppressed by combining the following configurations: a first configuration in which the width of the terminal sections T0, T1, T2, T3 is made larger than the width of the central parts of the active areas An0, An1, An2, An3; and a second configuration in which nitrogen is implanted in the active areas An0, An1, An2, An3. The first configuration makes it possible to disperse stress at the terminal sections T0, T1, T2, T3 and thus the effect that the development of a crystal defect from the terminal sections T0, T1, T2, T3 is suppressed can be obtained. The second configuration makes it possible to obtain the effect that a crystal defect produced in the active areas An0, An1, An2, An3 and a dislocation loop that causes a defect are restored.

In the first embodiment, it is desirable to combine the first configuration and second configuration mentioned above; however, this combination is not indispensable. For example, a crystal defect can be sufficiently suppressed by adopting only the first configuration. That is, a crystal defect can be sufficiently suppressed just by making the width of the terminal sections T0, T1, T2, T3 larger than the width of the central parts of the active area An0, An1, An2, An3. The second configuration in which nitrogen is implanted in the active areas An0, An1, An2, An3 makes it possible to restore a crystal defect produced in the active area An0, An1, An2, An3 and a dislocation loop that causes a defect. Therefore, the second configuration is desirable from the point of view of suppressing a crystal defect formed in the active areas An0, An1, An2, An3. As a side effect, however, the resistance values of the source regions and drain regions formed in the active areas An0, An1, An2, An3 can be increased. When the resistance values of a source region and a drain region are increased, the current driving force of the MISFETs comprising the SRAM is reduced and the characteristics of the SRAM are degraded. For this reason, taking the following measure also brings an advantage: the second configuration in which nitrogen is implanted in the active areas An0, An1, An2, An3 is not adopted; and the first configuration in which the width of the terminal sections T0, T1, T2, T3 is made larger than the width of the central parts of the active areas An0, An1, An2, An3 is adopted. That is, an advantage that the growth of a crystal defect starting at the terminal sections T0, T1, T2, T3 of the active areas An0, An1, An2, An3 can be suppressed without increasing the resistance value of the source regions or the drain regions.

Description will be given to what extent the width of the terminal sections T0, T1, T2, T3 should be increased to disperse stress from an element isolation region STI. First, consideration will be given to the active areas An0, An1, An2, An3 as n-channel MISFET formation regions. As illustrated in FIG. 4, the active areas An0, An1, An2, An3 are largest in width at the terminal sections T0, T1, T2, T3 (width in the x direction). However, there are areas different in width (width in the x direction) also in the central parts (inside). Therefore, the width of the terminal sections T0, T1, T2, T3 can be relatively defined relative to, for example, the narrowest areas positioned at the central parts of the active areas An0, An1, An2, An3. Specifically, the width of the terminal sections T0, T1, T2, T3 can be set to a value equal to or larger than 1.5 times the width of the narrowest areas positioned at the central parts of the active areas An0, An1, An2, An3. With this configuration, stress applied to the terminal sections T0, T1, T2, T3 can be sufficiently dispersed.

Description will be given to that, in the first embodiment, there are areas different in width (width in the x direction) also in the central parts (inside) of the active areas An0, An1, An2, An3. As illustrated in FIG. 4, the drive MISFET Qd1 and the transfer MISFET Qt1 as n-channel MISFETs are formed in the active area An1 as an n-type semiconductor region. The SRAM has the property that when there is no current difference between a current passed between the source region and the drain region of the drive MISFET Qd1 and a current passed between the source region and the drain region of the transfer MISFET Qt1, the SRAM does not operate. Especially, the current passed through the drive MISFET Qd1 must be made larger than the current passed through the transfer MISFET Qt1. In this embodiment, consequently, the width of the area of the active area An1 where the drive MISFET Qd1 is formed is made larger than the width of the area of the active area An1 where the transfer MISFET Qt1 is formed. That is, while the width of the gate electrode (gate length) of the drive MISFET Qd1 and the width of the gate electrode (gate length) of the transfer MISFET Qt1 are made equal to each other, the following measure is taken: the width of the area of the active area An1 where the drive MISFET Qd1 is formed is made larger than the width of the area of the active area An1 where the transfer MISFET Qt1 is formed. As a result, it is possible to make the current passed through the drive MISFET Qd1 larger than the current passed through the transfer MISFET Qt1 and to ensure a current difference between the drive MISFET Qd1 and the transfer MISFET Qt1. This applies not only to the active area An1 and but also to the active areas An0, An2, An3 where a drive MISFET and a transfer MISFET are formed. For example, in the active areas An0, An1, An2, An3 where an n-channel MISFET is formed, there are areas different in the width of the active areas An0, An1, An2, An3.

In the first embodiment, a current difference between the drive MISFET Qd1 and the transfer MISFET Qt1 is ensured by taking the following measure: the width of the area of the active area An1 where the drive MISFET Qd1 is formed is made larger than the width of the area of the active area An1 where the transfer MISFET Qt1 is formed. However, another configuration can be adopted to ensure a current difference between the drive MISFET Qd1 and the transfer MISFET Qt1. For example, the following measure is taken: the width of the active area An1 is made constant and the width of the gate electrode (gate length) of the drive MISFET Qd1; and the width of the gate electrode (gate length) of the transfer MISFET Qt1 are made different from each other.

In the first embodiment, either configuration can be adopted to ensure a current difference between a drive MISFET and a transfer MISFET. With either configuration, it is possible to make the width of the terminal sections T0, T1, T2, T3 of the active areas An0, An1, An2, An3 larger than the width of the central parts of the active areas An0, An1, An2, An3. That is, it is possible to make the width of the active areas An0, An1, An2, An3 largest at the terminal sections T0, T1, T2, T3 of the active areas An0, An1, An2, An3. As a result, it is possible to disperse stress from an element isolation region STI on the terminal sections T0, T1, T2, T3 and to suppress the growth of a crystal defect starting at the terminal sections T0, T1, T2, T3.

As described up to this point, one of the features of the first embodiment is as illustrated in FIG. 4: on the precondition that the active areas An0, An1, An2, An3 in n-channel MISFET formation regions are all configured in the isolated structure, the following measure is taken: the width of the terminal sections T0, T1, T2, T3 is made larger than the width of the central parts of the active areas An0, An1, An2, An3. That is, the first embodiment is a technical idea related to the shape of the active areas An0, An1, An2, An3 in n-channel MISFET formation regions. With respect to the active areas Ap1, Ap2 in p-channel MISFET formation regions, the first embodiment does not adopt the configuration in which the terminal sections are widened. The reason for this will be described below.

There is the fact that a crystal defect produced in active areas is more frequently produced in active areas formed in an n-channel MISFET formation region than in active areas formed in a p-channel MISFET formation region. That is, the active areas Ap1, Ap2 as p-channel MISFET formation regions illustrated in FIG. 4 are lower in the frequency of the production of crystal defects than the active areas An0, An1, An2, An3 as n-channel MISFET formation regions.

According to the result of review carried out by the present inventors, the background of this fact can be thought as follows. In an n-channel MISFET, an n-type impurity, such as phosphorus (P) and arsenic (As), is implanted in an active area to form a source region or a drain region. In a p-channel MISFET formation region, meanwhile, a p-type impurity, such as boron (B) and boron fluoride ($BF_2$), is implanted in an active area to form a source region or a drain region. When a crystal receives stress at this time, a dislocation is produced in the crystal. When this dislocation grows, a crystal defect is formed. The present inventors found that the threshold value of stress that grows a dislocation differs depending on the type of an impurity implanted in an active area. More specific description will be given. When an n-type impurity, such as phosphorus and arsenic, is implanted in an active area, stress required for the growth of a dislocation is reduced compared with when a p-type impurity, such as boron and boron fluoride, is implanted in an active area. That is, in an active area implanted with an n-type impurity, a dislocation is grown by smaller stress than in an active area implanted with a p-type impurity. For this reason, a crystal defect is more prone to be produced in an active area where an n-channel MISFET is formed than in an active area where a p-channel MISFET is formed. Therefore, it is apparent that in an n-channel MISFET formation region it is required to suppress a crystal defect produced in an active area.

As illustrated in FIG. 4, further, the active area Ap2 as a p-channel MISFET formation region is joined with the substrate potential supply section Ln1. In this case, there is apprehension that the same problem as in cases where an active area as an n-channel MISFET formation region is configured in the H-shaped structure can arise. Since the substrate potential supply section Ln1 and the active area Ap2 are joined with each other, a problem can arise. A crystal defect produced in the substrate potential supply section Ln1 can grow and reach the active area Ap2. In the p-channel MISFET formation regions, the active area Ap2 is a p-type semiconductor region and the substrate potential supply section Ln1 is an n-type semiconductor region. Therefore, the substrate potential supply section Ln1 can be implanted with nitrogen and it turns out that the production of a crystal defect is suppressed in the substrate potential supply section Ln1. For this reason, it can be thought that a crystal defect produced in the substrate potential supply section Ln1 rarely grows and reaches the active area Ap2 joined with the substrate potential supply section Ln1.

It is apparent from the foregoing that in the active areas Ap1, Ap2 as p-channel MISFET formation regions, a problem of crystal defects is not so serious as in the active areas An0, An1, An2, An3 as n-channel MISFET formation regions. Therefore, in the active area Ap1 or Ap2 as a p-channel MISFET formation region, the configuration characteristic of the first embodiment is not adopted. However, the configuration characteristic of the first embodiment may be adopted in the active areas Ap1, Ap2 as p-channel MISFET formation regions and in this case a crystal defect can be further suppressed. One of the features of the first embodiment is that the following measure is taken on the precondition that the active areas An0, An1, An2, An3 in n-channel MISFET formation regions are all configured in the isolated structure: the width of the terminal sections T0, T1, T2, T3 is made larger than the width of the central parts of the active areas An0, An1, An2, An3. That is, the first embodiment produces especially pronounced effect when the invention is applied to the following: the active areas An0, An1, An2, An3 in n-channel MISFET formation regions where the growth of a crystal defect starting at the terminal sections T0, T1, T2, T3 poses a problem.

Figure 5:
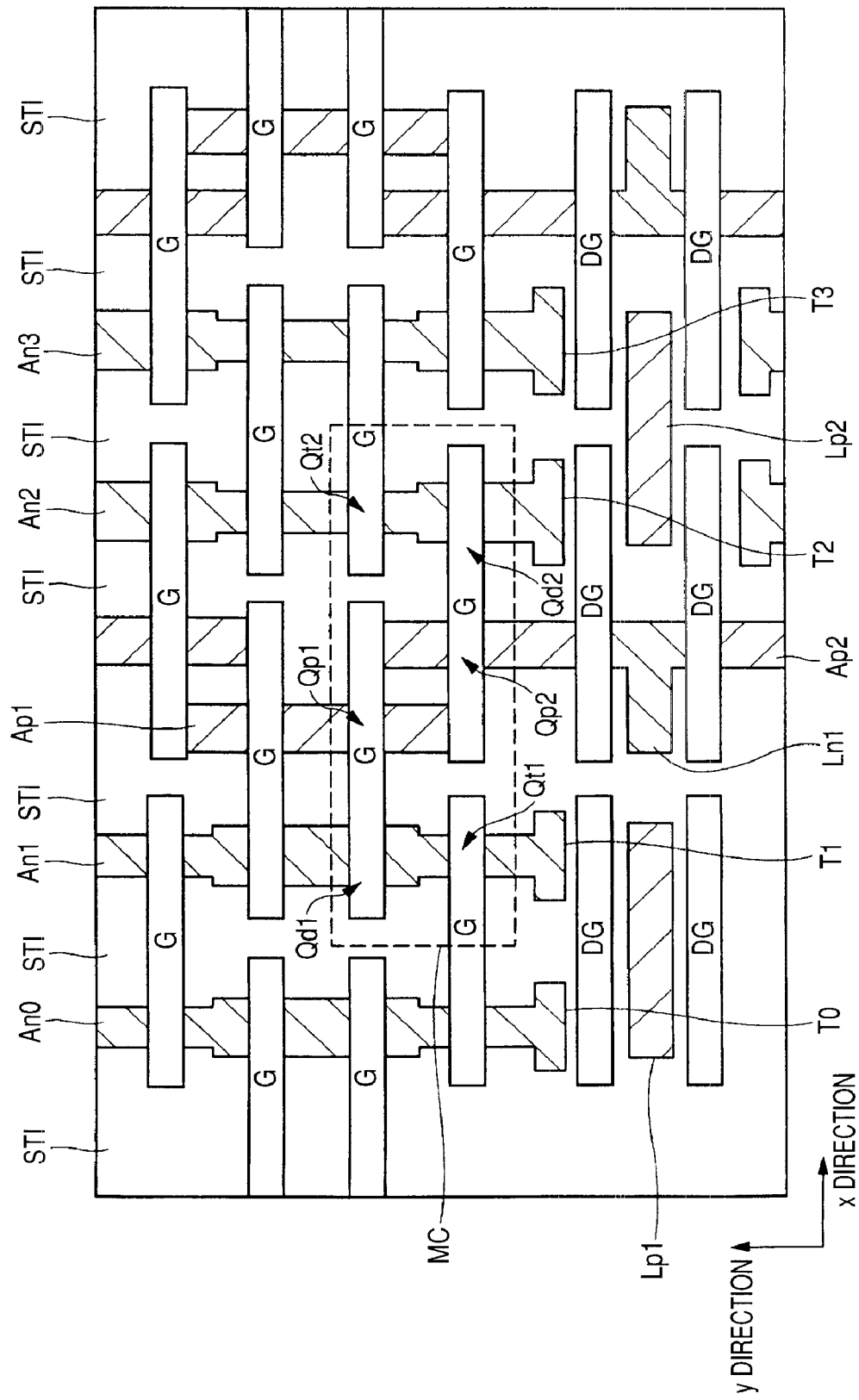
FIG. 5 is a drawing illustrating another example of the planar configuration of SRAM.

FIG. 4 illustrates an example of the following cases: cases where the width of the active areas An0, An1, An2, An3 of the isolated structure is made larger at the respective terminal sections T0, T1, T2, T3 than at the respectively parts (central parts) back from the terminal sections T0, T1, T2, T3. FIG. 5 illustrates another example of the following cases: cases where the width of the active areas An0, An1, An2, An3 of the isolated structure is made larger at the respective terminal sections T0, T1, T2, T3 than at the respectively parts (central parts) back from the terminal sections T0, T1, T2, T3.

In the example illustrated in FIG. 5, the respective terminal sections T0, T1, T2, T3 of the active areas An0, An1, An2, An3 are formed in a so-called hammerhead shape. The following can also be implemented by forming the terminal sections T0, T1, T2, T3 in a hammerhead shape: the width of the active areas An0, An1, An2, An3 can be made larger at the terminal sections T0, T1, T2, T3 than at the respectively parts (central parts) back from the terminal sections T0, T1, T2, T3. As a result, it is possible to disperse stress from an element isolation region STI on the terminal sections T0, T1, T2, T3 and to suppress the growth of a crystal defect starting at the terminal sections T0, T1, T2, T3.

The following cases can be included in the examples of cases where the width of the active areas An0, An1, An2, An3 can be made larger at the terminal sections T0, T1, T2, T3 than at the respectively parts (central parts) back from the terminal sections T0, T1, T2, T3: cases where the terminal sections T0, T1, T2, T3 are formed in an L shape (FIG. 4) and cases where the terminal sections T0, T1, T2, T3 are formed in a hammerhead shape (FIG. 5).

Figure 6:
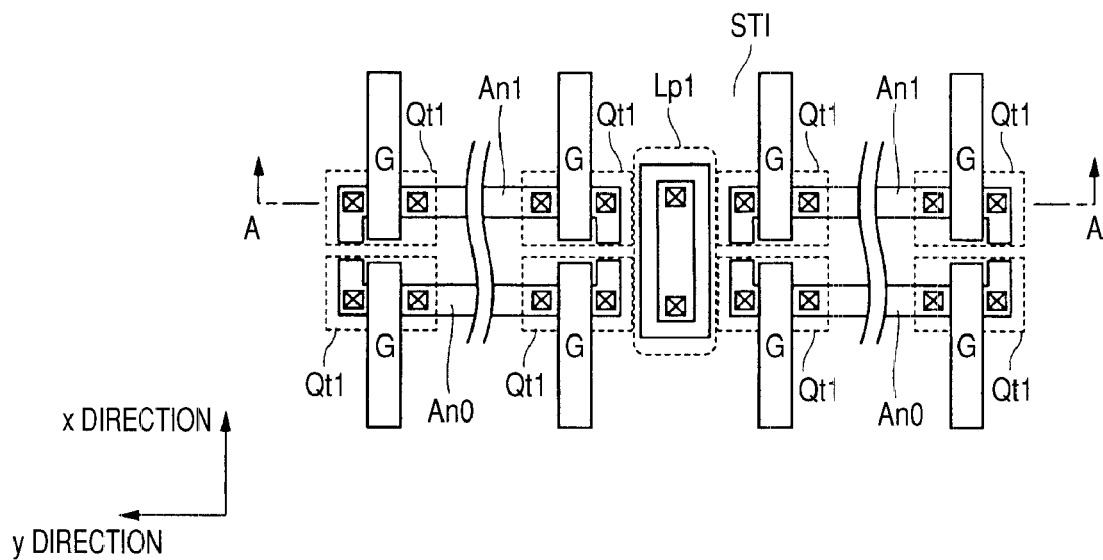
FIG. 6 is a drawing illustrating the planar configuration of SRAM in a simplified manner.

Up to this point, description has been, given to the planar structure of the SRAM (semiconductor device) as a configuration characteristic of the first embodiment. Next, description will be given to the cross-sectional structure of the SRAM. FIG. 6 is a simplified planar configuration of the SRAM on which the description of the cross-sectional structure of the SRAM is based. FIG. 6 is obtained by simplifying FIG. 4 and FIG. 5 and is depicted with a focus on the active areas An0 and the active areas An1. FIG. 6 is so depicted that FIG. 4 and FIG. 5 are turned by 90 degrees in the vertical direction and in the horizontal direction. More specific description will be given. In FIG. 4 and FIG. 5, the direction of the top and bottom of the page is taken as the y direction and the direction of the right and left of the page is taken as the x direction. In FIG. 6, meanwhile, the direction of the top and bottom of the page is taken as the x direction and the direction of the right and left of the page is taken as the y direction.

As illustrated in FIG. 6, the active areas An0 and the active areas An1 are so disposed that the active areas An0 and the active areas An1 are aligned in the x direction and are extended in the y direction. Between the left active area An0 and the right active area An0 and between the left active area An1 and the right active area An1, there is formed a substrate potential supply section Lp1. This substrate potential supply section Lp1 and the active areas An0, An1 are isolated from each other. An element isolation region STI is so formed that it encircles the active areas An0, An1 and the substrate potential supply section Lp1.

The terminal sections of the active areas An0, An1 isolated from the substrate potential supply section Lp1 are in an L shape. This point is characteristic of the first embodiment and the following can be implemented by forming the terminal sections of the active areas An0, An1 in an L shape: it is possible to disperse stress from the element isolation region STI and to suppress the growth of a crystal defect starting at the terminal sections.

Over the active areas An0 and the active areas An1, there are extended gate electrodes G in the direction intersecting the direction (y direction) of extension of the active areas An0, An1. MISFETs are formed by the gate electrodes G and the source regions and drain regions formed in the active areas An0, An1. In FIG. 6, there are formed transfer MISFETs Qt1, which are formed at the terminal sections of the active areas An0, An1. FIG. 6 shows only the area in proximity to the terminal sections of the active areas An0, An1 and only the transfer MISFETs Qt1 are shown in the drawing. In reality, however, drive MISFETs are also formed in the active areas An0, An1.

Figure 7:
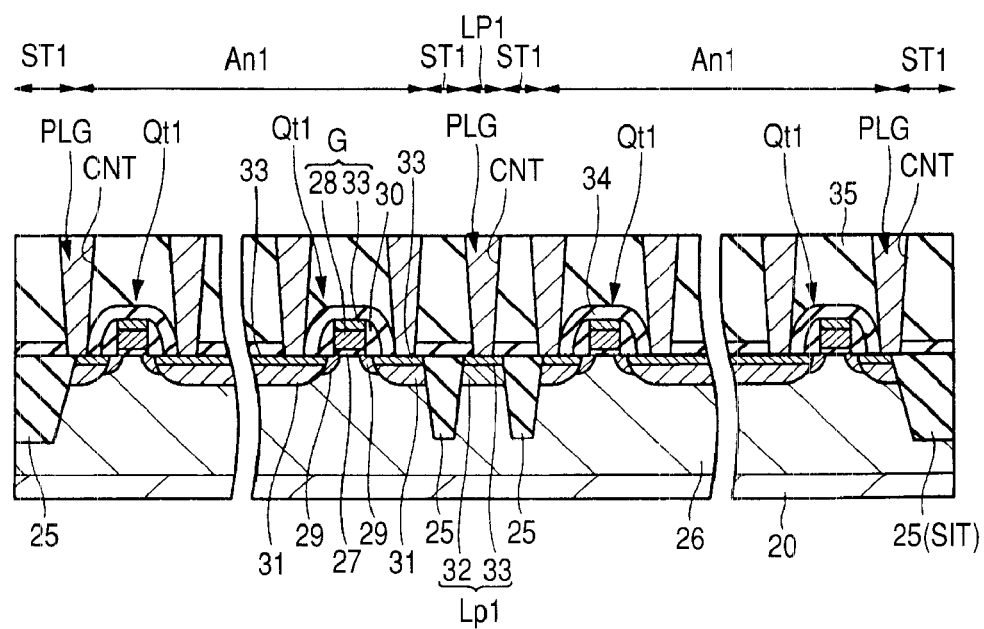
FIG. 7 is a sectional view taken along line A-A of FIG. 6.

Description will be given to the cross-sectional structure of MISFETs comprising the SRAM with the transfer MISFETs Qt1 illustrated in FIG. 6 taken as an example. FIG. 7 is a sectional view taken along line A-A of FIG. 6. As illustrated in FIG. 7, an element isolation region 25 (STI) is formed in the principal surface of the semiconductor substrate 20. The active areas An1 and the substrate potential supply section Lp1 are divided and isolated from each other by the element isolation region 25. In the semiconductor substrate 20, there is formed a p-type well 26 as a p-type semiconductor region.

Transfer MISFETs Qt1 are formed over the active areas An1 divided by the element isolation region 25. Each transfer MISFET Qt1 has a gate insulating film 27 over an active area An1, and a gate electrode G is formed over the gate insulating film 27. The gate electrode G is comprised of a laminated film of a polysilicon film 28 and a cobalt silicide film 33 formed over the surface of the polysilicon film 28. The cobalt silicide film 33 is formed to reduce the resistance of the gate electrode G.

Over the side faces on both sides of the gate electrode G, there is formed a side wall 30, and in the semiconductor substrate 20 directly under the side walls 30, there is formed a shallow low-concentration n-type impurity diffusion region 29. The shallow low-concentration n-type impurity diffusion regions 29 are semiconductor regions obtained by implanting an n-type impurity, such as phosphorus and arsenic, in the semiconductor substrate 20 and are formed in alignment with the gate electrode G. In the portions of the semiconductor substrate 20 positioned outside the shallow low-concentration n-type impurity diffusion regions 29, there is formed a deep high-concentration n-type impurity diffusion region 31. The deep high-concentration n-type impurity diffusion regions 31 are also semiconductor regions obtained by implanting an n-type impurity, such as phosphorus and arsenic, in the semiconductor substrate 20 and are formed in alignment with the side walls 30.

The source regions and drain regions of the transfer MISFETs Qt1 are formed by the shallow low-concentration n-type impurity diffusion regions 29 and the deep high-concentration n-type impurity diffusion regions 31. Therefore, the source regions and drain regions of the transfer MISFETs Qt1 are formed in the active areas An1. In other words, the source regions and drain regions of the transfer MISFETs Qt1 comprise part of the active areas An1. Forming each of the source regions and the drain region of the shallow low-concentration n-type impurity diffusion region 29 and the high-concentration n-type impurity diffusion region 31 makes it possible to form the source regions and the drain regions in the LDD structure. As a result, it is possible to suppress electric field concentration under the ends of the gate electrode G. Over the surfaces of the deep high-concentration n-type impurity diffusion regions 31, there is formed a cobalt silicide film 33. The cobalt silicide films 33 are formed to reduce the resistance of the source regions and drain regions.

The source region and drain region (active area An1) of each transfer MISFET Qt1 is also implanted with nitrogen though not shown in the drawing. As a result, it is possible to restore a crystal defect formed in the active areas An1 and a dislocation loop that causes a crystal defect.

In the substrate potential supply section Lp1 isolated by the element isolation region 25, there are formed a p-type semiconductor region 32 and a cobalt silicide film 33 formed over the surface of the p-type semiconductor region 32. Therefore, the substrate potential supply section Lp1 is comprised of the p-type semiconductor region 32 and the cobalt silicide film 33 and thus electrically coupled with the p-type well 26 formed in the semiconductor substrate 20. That is, substrate potential (for example, 0V) can be supplied from the substrate potential supply section Lp1 to the semiconductor substrate 20.

Description will be given to the structure of wiring coupled with each of the transfer MISFETs Qt1 and the substrate potential supply section Lp1. Over the transfer MISFETs Qt1 and the substrate potential supply section Lp1, there is formed a silicon nitride film 34 so that the transfer MISFETs Qt1 and the substrate potential supply section Lp1 are covered therewith. Over the silicon nitride films 34, there is formed a silicon oxide film 35. An interlayer insulating film is formed of the silicon nitride film 34 and the silicon oxide film 35. In the interlayer insulating film, there is formed a contact hole CNT that penetrates the interlayer insulating film and reaches the cobalt silicide film 33 comprising the source region and drain region of each transfer MISFET Qt1. Over the substrate potential supply section Lp1, there is similarly formed a contact hole CNT that reaches the cobalt silicide film 33 comprising the substrate potential supply section Lp1.

In each contact hole CNT, a titanium/titanium nitride film as a barrier conductor film is formed, and a tungsten film is formed so that the contact hole CNT is filled therewith. By filling each contact hole CNT with the titanium/titanium nitride film and the tungsten film, a conductive plug PLG is formed. In the example illustrated in FIG. 7, a wiring is formed over the interlayer insulating film, though not shown in the drawing, and this wiring and the plugs PLG are electrically coupled with each other. The wiring is formed of a laminated film of, for example, a titanium/titanium nitride film, an aluminum film, and a titanium/titanium nitride film. In addition, a multilayer interconnection layer is formed in the upper layer of the wiring and the above-mentioned uppermost wiring layer is formed in the uppermost layer thereof.

As mentioned above, the transfer MISFETs Qt1 as n-channel MISFETs and the substrate potential supply section Lp1 are formed over the semiconductor substrate 20. In the active areas An1, drive MISFETs as n-channel MISFETs are also formed and these drive MISFETs are of the same configuration as of the transfer MISFETs Qt1. Over the semiconductor substrate 20, there is also formed a load MISFET comprising a memory cell of the SRAM. The load MISFETs are p-channel MISFETs and formed in an active area different from the active areas An0, An1.

Description will be given to the configuration of the load MISFET as a p-channel MISFET though not shown in FIG. 7. The basic configuration of the load MISFET as a p-channel MISFET is the same as that of the transfer MISFET Qt1 as an n-channel MISFET. The load MISFET as a p-channel MISFET has a gate insulating film over an n-type well, and a gate electrode is formed over the gate insulating film. The gate electrode is comprised of a laminated film of a polysilicon film and a cobalt silicide film formed over the surface of the polysilicon film. The cobalt silicide film is formed to reduce the resistance of the gate electrode.

Over the side faces on both sides of the gate electrode, there is formed a side wall, and in the semiconductor substrate directly under the side walls, there is formed a shallow low-concentration p-type impurity diffusion region. The shallow low-concentration p-type impurity diffusion regions are semiconductor regions obtained by implanting a p-type impurity, such as boron, in the semiconductor substrate and are formed in alignment with the gate electrode. In the portions of the semiconductor substrate positioned outside the shallow low-concentration p-type impurity diffusion regions, there is formed a deep high-concentration p-type impurity diffusion region. The deep high-concentration p-type impurity diffusion regions are also semiconductor regions obtained by implanting a p-type impurity, such as boron, in the semiconductor substrate and are formed in alignment with the side walls.

The source regions and drain regions of the p-channel MISFETs are formed by the shallow low-concentration p-type impurity diffusion regions and the deep high-concentration p-type impurity diffusion regions. Forming each of the source regions and the drain regions of the shallow low-concentration p-type impurity diffusion region and the deep high-concentration p-type impurity diffusion region makes it possible to form the source regions and the drain regions in the LDD structure. As a result, it is possible to suppress electric field concentration under the ends of the gate electrode. Over the surfaces of the deep high-concentration p-type impurity diffusion regions, there is formed a cobalt silicide film. The cobalt silicide film is formed to reduce the resistance of the source regions and drain regions. The load MISFETs as p-channel MISFETs are different from the transfer MISFETs Qt1 as n-channel MISFETs in that the source regions or drain regions of the load MISFETs are not implanted with nitrogen. The reason why the source regions or drain regions of p-channel MISFETs is not implanted with nitrogen is as follows: the source regions and drain regions of the p-channel MISFETs are formed of p-type semiconductor regions and thus nitrogen as an n-type impurity cannot be implanted there.

The SRAM in the first embodiment is configured as mentioned above. Hereafter, description will be given to a method of manufacturing an LCD driver (semiconductor device) including the SRAM in the first embodiment with reference to drawings. In the description of the manufacturing process for the semiconductor device, a section taken along line A-A of FIG. 6 will be taken as an example.

Figure 8:
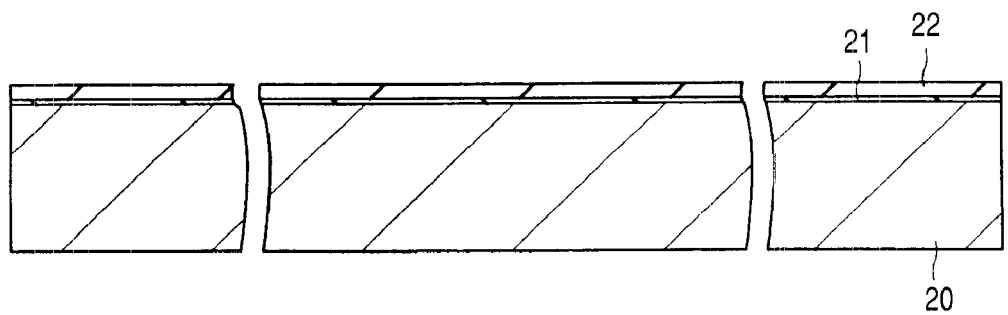
FIG. 8 is a sectional view illustrating a manufacturing process for a semiconductor device in a first embodiment.

First, as illustrated in FIG. 8, a silicon oxide film 21, 5 nm to 20 nm or so in thickness, is formed over the semiconductor substrate 20 and then a silicon nitride film 22, 50 nm to 200 nm in thickness, is formed over the silicon oxide film 21. The silicon oxide film 21 can be formed using, for example, thermal oxidation and the silicon nitride film 22 can be formed using, for example CVD (Chemical Vapor Deposition).

Figure 9:
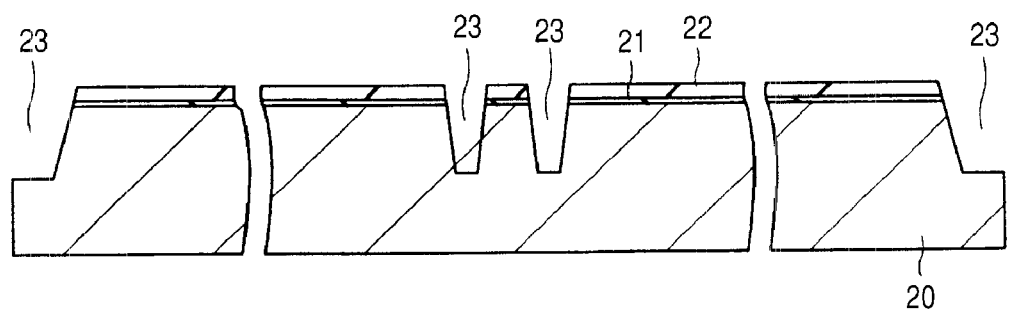
FIG. 9 is a sectional view illustrating the manufacturing process for the semiconductor device, following FIG. 8.
Figure 10:
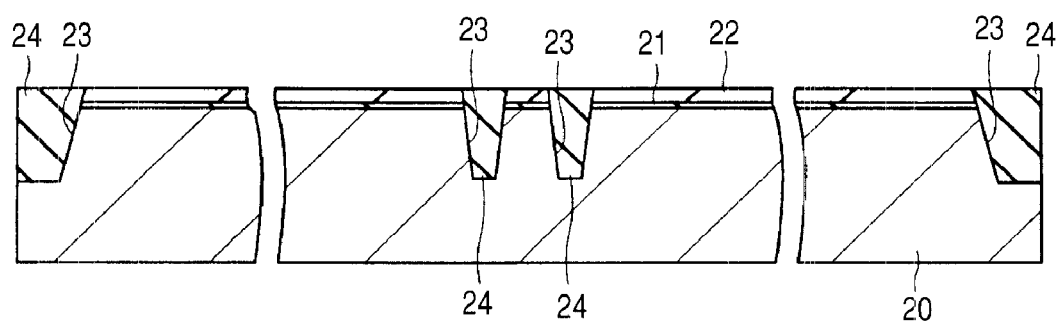
FIG. 10 a sectional view illustrating the manufacturing process for the semiconductor device, following FIG. 9.

Subsequently, the silicon nitride film 22 is patterned using photolithography and etching, as illustrated in FIG. 9. The patterning of the silicon nitride film 22 is carried out so that an opening is formed in an area where an element isolation region is to be formed. Using the patterned silicon nitride film 22 as a mask, the exposed silicon oxide film 21 and the semiconductor substrate 20 positioned under the silicon oxide film 21 are successively etched to form an element isolation trench 23 in the semiconductor substrate 20. This element isolation trench 23 is, for example, 250 nm to 400 nm in thickness.

Subsequently, a silicon oxide film 24 is formed over the principal surface of the semiconductor substrate 20 with the element isolation trench 23 formed therein. The silicon oxide film 24 can be formed using, for example, plasma CVD using HDP (High Density Plasma) and the film thickness thereof is, for example, 600 nm or so. At this time, the following processing may be carried out before filling the element isolation trench 23 with the silicon oxide film 24: a silicon oxide film is formed over the surface of the element isolation trench 23 by thermal oxidation to remedy damage arising from dry etching carried out when the element isolation trench 23 is formed. Further, heat treatment may be conducted for 30 seconds to 60 seconds in a NO gas atmosphere of 50% to 100% at 1000° C. to 1100° C. to form a silicon nitride film over the surface of the element isolation trench 23. Forming this silicon nitride film over the surface of the element isolation trench 23 makes it possible to reduce stress from the element isolation region thereafter formed and to suppress the production of a crystal defect in active areas isolated by the element isolation region. The silicon oxide film 24 formed over the semiconductor substrate 20 so that the element isolation trench 23 is filled therewith is polished by CMP (Chemical Mechanical Polishing). This polishing is carried out until the silicon nitride film 22 formed over the semiconductor substrate 20 is exposed.

Figure 11:
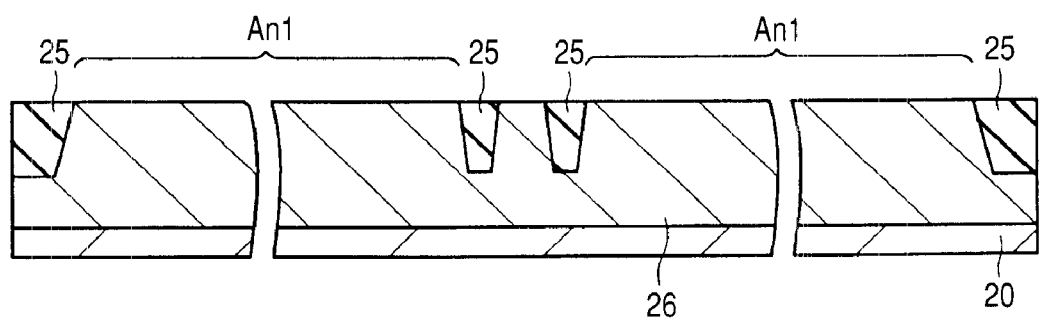
FIG. 11 a sectional view illustrating the manufacturing process for the semiconductor device, following FIG. 10.

Subsequently, the silicon nitride film 22 formed over the semiconductor substrate 20 is removed and then a p-type well 26 is formed in the semiconductor substrate 20 as illustrated in FIG. 11. The p-type well 26 is formed by implanting a p-type impurity, such as boron (B) and boron fluoride ($BF_2$), in the semiconductor substrate 20 using ion implantation. Thereafter, the silicon oxide film 21 formed over the semiconductor substrate 20 is removed. Thus the element isolation region 25 can be formed. An active area An1 is formed in regions isolated and divided by the element isolation region 25.

Figure 12:
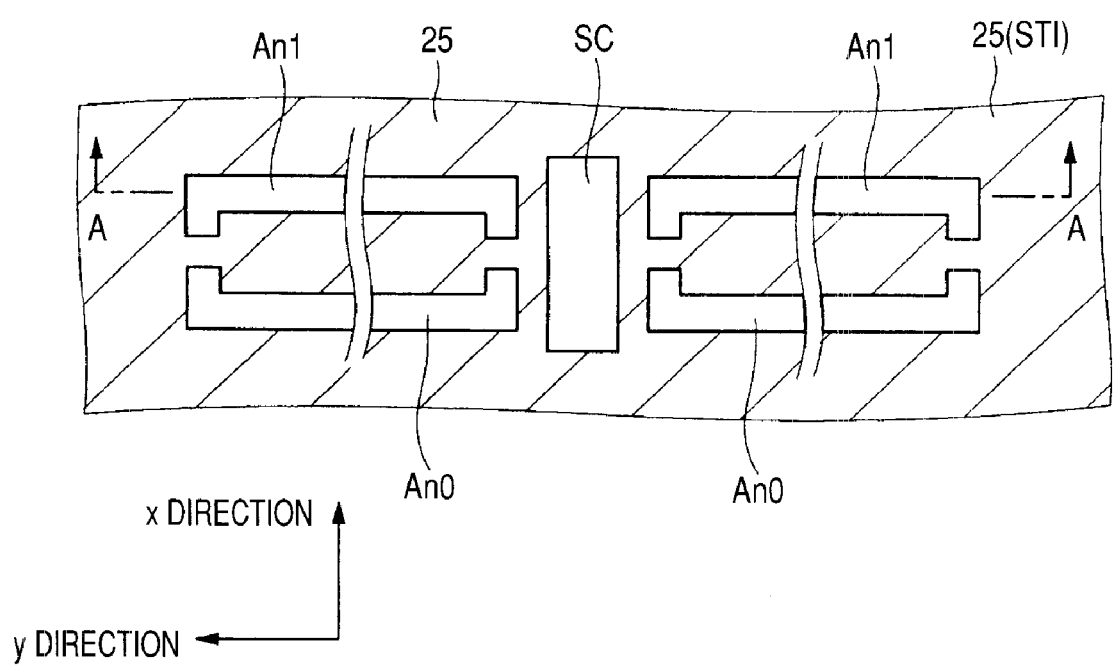
FIG. 12 is a plan view corresponding to the sectional view in FIG. 11.

FIG. 12 is a plan view illustrating active areas An1 divided by an element isolation region 25. A section taken along line A-A of FIG. 12 corresponds to FIG. 11. The following can be implemented by forming the element isolation region 25 over the semiconductor substrate as illustrated in FIG. 12: it is possible to divide active areas An0, An1 and a substrate contact section SC and form the active area An0, An1 and the substrate contact section SC so that they are isolated from each other by the element isolation region 25. The following can be implemented by adding a twist to patterning at the above mentioned step of forming the element isolation region 25: the width of the active areas An0, An1 in the x direction can be made larger at the terminal sections than at the central parts. That is, the terminal sections of the active areas An0, An1 can be formed in an L shape. As a result, it is possible to disperse stress from the element isolation region 25 on the terminal sections and to suppress the growth of a crystal defect starting at the terminal sections.

Figure 13:
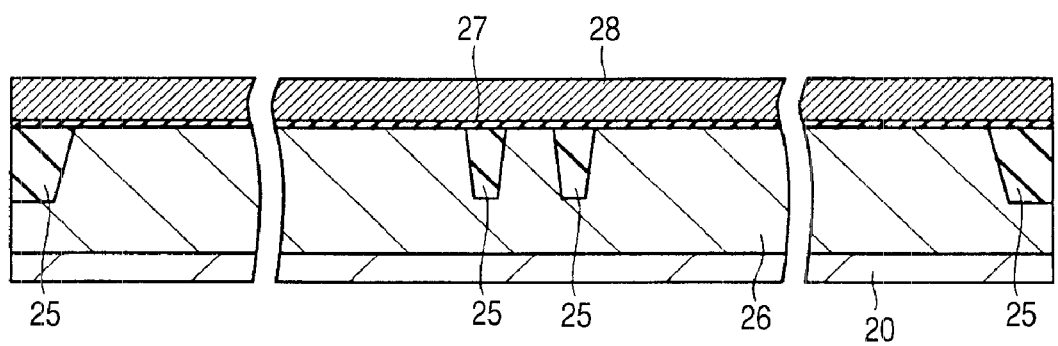
FIG. 13 is a sectional view illustrating the manufacturing process for the semiconductor device, following FIG. 11.

Subsequently, as illustrated in FIG. 13, a gate insulating film 27 is formed over the semiconductor substrate 20. The gate insulating film 27 can be formed of a silicon oxynitride film (SiON), for example, 3 nm or so in thickness. That is, the semiconductor device may be so structured that nitrogen is segregated at the interface between the gate insulating film 27 comprised of a silicon oxide film and the semiconductor substrate 20. The silicon oxynitride film can effectively suppress the generation of an interface state in a film and reduce electron traps in comparison with the silicon oxide film. Therefore, it is possible to enhance the hot carrier resistance of the gate insulating film 27 and enhance insulation resistance. Further, the silicon oxynitride film is more difficult for an impurity to penetrate than the silicon oxide film. For this reason, when a silicon oxynitride film is used for the gate insulating film 27, it is possible to suppress variation in threshold voltage caused by the diffusion of the impurity in the gate electrode to the semiconductor substrate side. The silicon oxynitride film can be formed by thermal treatment of the semiconductor substrate 20 in an atmosphere containing nitrogen, such as NO, $NO_2$, and $NH_3$. The same effect can also be obtained by taking the following procedure: the gate insulating film 27 comprised of a silicon oxide film is formed over the surface of the semiconductor substrate 20; and then the semiconductor substrate 20 is thermally treated in an atmosphere containing nitrogen to segregate nitrogen at the interface between the gate insulating film 27 and the semiconductor substrate 20. The gate insulating film 27 can also be formed of, for example, a silicon oxide film. The silicon oxide film can be formed using, for example, thermal oxidation.

The gate insulating film 27 may be formed of a high-dielectric constant film higher in dielectric constant than, for example, the silicon oxide film. A silicon oxide film has been conventionally used as the gate insulating film 27 from the viewpoint of that the silicon oxide film is high in insulation resistance and excellent in the electrical and physical stability at a silicon-silicon oxide interface. However, demand for reducing the film thickness of the gate insulating film 27 has grown in conjunction with the microminiaturization of elements. If such a thin silicon oxide film is used as the gate insulating film 27, electrons flowing in the channel of MISFET tunnel through a barrier formed of the silicon oxide film and then flow to the gate electrode. That is, a so-called tunnel current is produced.

To cope with this, materials higher in dielectric constant than the silicon oxide film have been used. As a result, a high dielectric film that makes it possible to increase the physical film thickness without change in capacitance has been used. When the high dielectric film is used, it is possible to increase the physical film thickness without change in capacitance and thus reduce a leakage current.

For example, a hafnium oxide film ($HfO_2$ film), one of hafnium oxides, is used as the high dielectric film. In place of the hafnium oxide film, other hafnium-based insulating films can be used. Such hafnium-based insulating films include hafnium aluminate film, HfON film (hafnium oxynitride film), HfSiO film (hafnium silicate film), HfSiON film (hafnium silicon oxynitride film), and HfAlO film. Further, a hafnium-based insulating film obtained by implanting an oxide, such as tantalum oxide, niobium oxide, titanium oxide, zirconium oxide, lanthanum oxide, and yttrium oxide, in the hafnium-based insulating film can also be used. The hafnium-based insulating film is higher in dielectric constant than the silicon oxide film and the silicon oxynitride film similarly with the hafnium oxide film. Therefore, the same effect as when a hafnium oxide film is used can be obtained.

Subsequently, a polysilicon film 28, for example, 150 nm or so in thickness, is formed over the gate insulating film 27. The polysilicon film 28 can be formed using, for example, CVD. Using photolithography and ion implantation, an n-type impurity, such as phosphorus and arsenic, is implanted in the polysilicon film 28 formed in an active area (transfer MISFET formation region).

Figure 14:
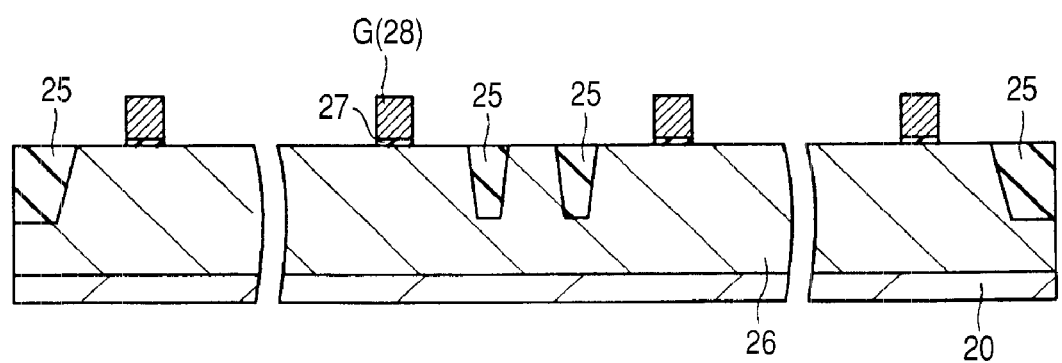
FIG. 14 is a sectional view illustrating the manufacturing process for the semiconductor device, following FIG. 13.

Subsequently, the polysilicon film 28 is processed by etching using a patterned resist film as a mask, as illustrated in FIG. 14, to form gate electrodes G in transfer MISFET formation regions (n-channel MISFET formation regions).

Figure 15:
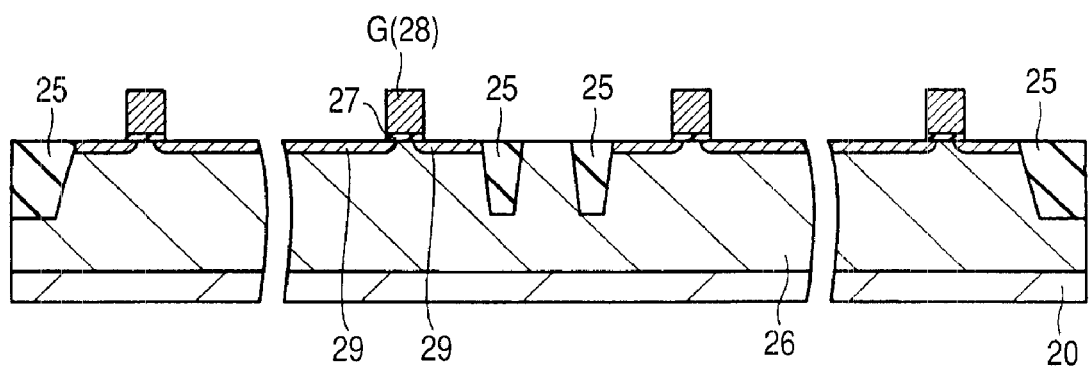
FIG. 15 is a sectional view illustrating the manufacturing process for the semiconductor device, following FIG. 14.

Subsequently, as illustrated in FIG. 15, shallow low-concentration n-type impurity diffusion regions (extension regions) 29 aligned with the gate electrodes G of the transfer MISFETs (n-channel MISFETs) are formed by photolithography and ion implantation. The shallow low-concentration n-type impurity diffusion regions 29 are semiconductor regions.

Figure 16:
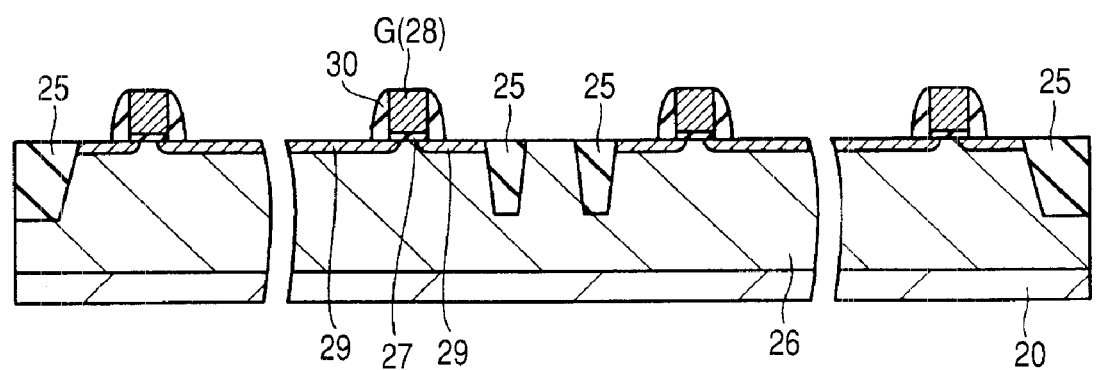
FIG. 16 is a sectional view illustrating the manufacturing process for the semiconductor device, following FIG. 15.

Thereafter, as illustrated in FIG. 16, a silicon oxide film is formed over the semiconductor substrate 20. The silicon oxide film can be formed using, for example, CVD. Then the silicon oxide film is anisotropically etched to form a side wall 30 over the side faces of the gate electrodes G. In this embodiment, the side walls 30 are formed of a silicon oxide film of monolayer. However, the invention is not limited to this and the side walls comprised of a laminated film of, for example, a silicon nitride film and a silicon oxide film may be formed.

Figure 17:
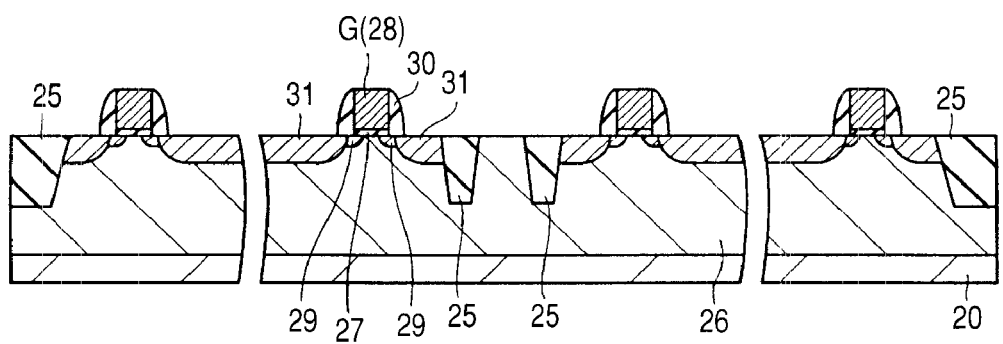
FIG. 17 is a sectional view illustrating the manufacturing process for the semiconductor device, following FIG. 16.

Subsequently, as illustrated in FIG. 17, deep high-concentration n-type impurity diffusion regions 31 aligned with the side walls 30 are formed in the transfer MISFET formation regions (n-channel MISFET formation regions) by photolithography and ion implantation. The deep high-concentration n-type impurity diffusion regions 31 are semiconductor regions. Source regions are formed by the deep high-concentration n-type impurity diffusion regions 31 and the shallow low-concentration n-type impurity diffusion region 29. Similarly, drain regions are formed by the deep high-concentration n-type impurity diffusion regions 31 and the shallow low-concentration n-type impurity diffusion regions 29. Forming source regions and drain regions of the shallow n-type impurity diffusion regions 29 and the deep n-type impurity diffusion regions 31, as mentioned above, makes it possible to form the source regions and the drain regions in the LDD (Lightly Doped Drain) structure.

Figure 18:
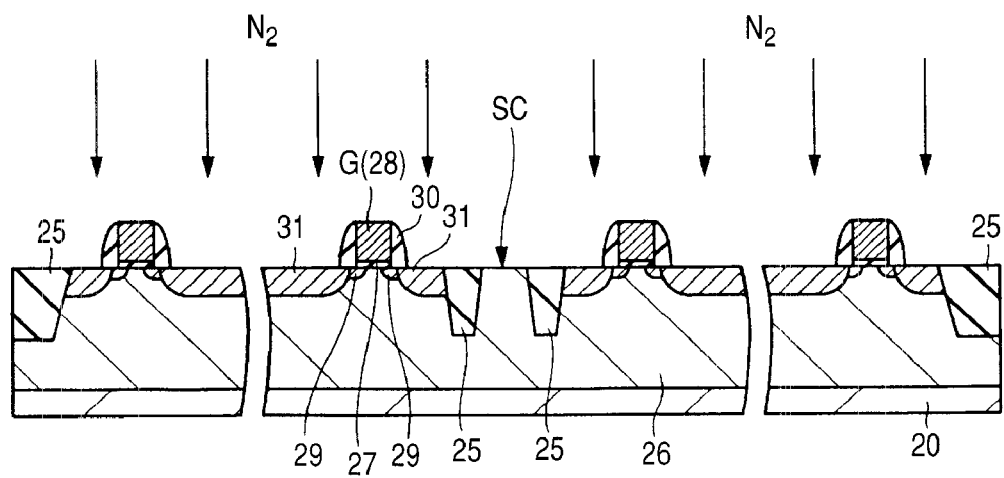
FIG. 18 is a sectional view illustrating the manufacturing process for the semiconductor device, following FIG. 17.

Subsequently, as illustrated in FIG. 18, the transfer MISFET formation regions (n-channel MISFET formation regions) are implanted with nitrogen. The implantation of nitrogen can be carried out by ion implantation. The dose of nitrogen can be set within the range of, for example, $1 \times 10^{14}$ to $1 \times 10^{16}$ (pieces) per unit square centimeter. However, it is required to mask the substrate contact section SC with a resist film to prevent nitrogen from being implanted in the substrate contact section SC.

The implantation of nitrogen in the source regions and drain regions (active areas) of the transfer MISFETs (n-channel MISFETs) produces the following effect: a crystal defect or a dislocation loop layer that is formed as the result of the implantation of an n-type impurity carried out to form source regions and drain regions can be restored. In the description of the first embodiment, a case where nitrogen is implanted after the formation of the source regions and drain regions of the transfer MISFETs (n-channel MISFETs) has been taken as an example. Instead, nitrogen may be implanted before the formation of the source regions and drain regions of the transfer MISFETs (n-channel MISFETs). After this step, heat treatment is conducted at a temperature of 1000° C. or so. As a result, the implanted impurity is activated.

Figure 19:
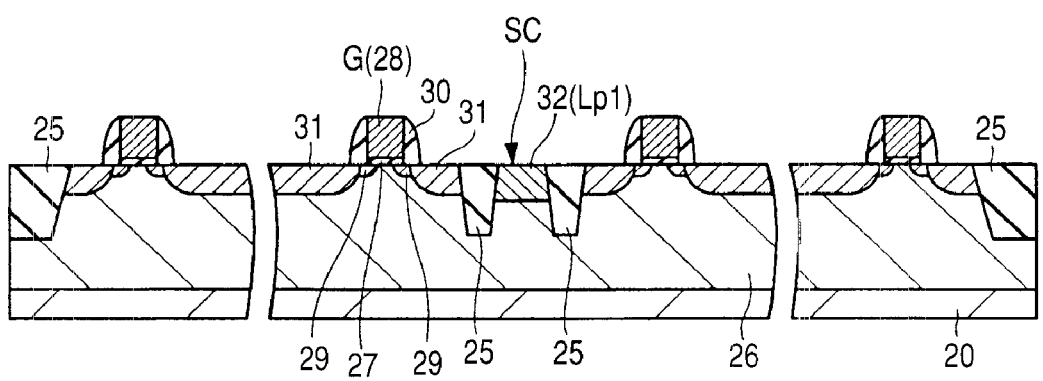
FIG. 19 is a sectional view illustrating the manufacturing process for the semiconductor device, following FIG. 18.

Subsequently, as illustrated in FIG. 19, a p-type semiconductor region 32 is formed in the substrate contact section SC of the semiconductor substrate 20 by photolithography and ion implantation. The p-type semiconductor region 32 can be formed by implanting, for example, boron or boron fluoride in the semiconductor substrate 20. This p-type semiconductor region 32 makes a substrate potential supply section Lp1.

Thereafter, a cobalt film is formed over the semiconductor substrate 20. At this time, the cobalt film is formed in direct contact with the gate electrodes G. Similarly, the cobalt film is brought into direct contact with the deep high-concentration n-type impurity diffusion regions 31.

Figure 20:
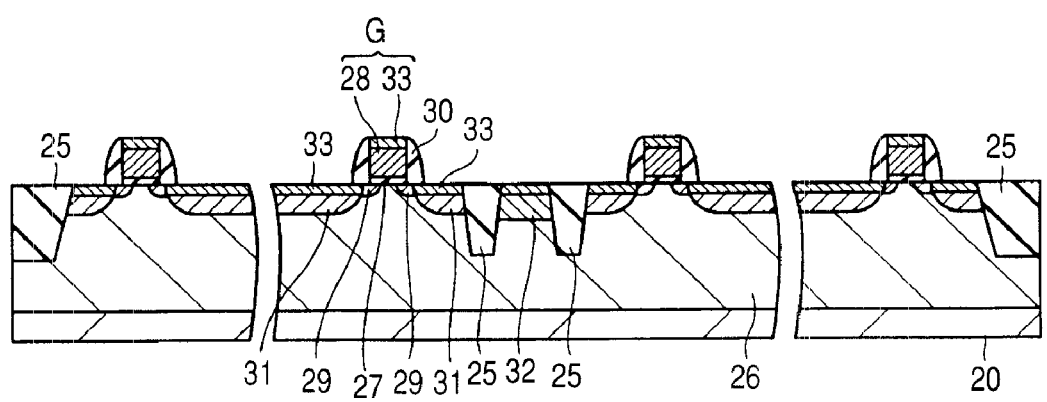
FIG. 20 is a sectional view illustrating the manufacturing process for the semiconductor device, following FIG. 19.

The cobalt film can be formed by, for example, sputtering. After the formation of the cobalt film, heat treatment is conducted to cause the polysilicon film 28 comprising the gate electrodes G and the cobalt film to react with each other to form a cobalt silicide film 33 as illustrated in FIG. 20. As a result, the gate electrodes G are rendered of the laminated structure of the polysilicon film 28 and the cobalt silicide film 33. The cobalt silicide films 33 are formed to reduce the resistance of the gate electrodes G. As the result of the above heat treatment, similarly, silicon and the cobalt film react with each other also over the surfaces of the deep high-concentration n-type impurity diffusion regions 31, and a cobalt silicide film 33 is formed there. For this reason, the resistance can be reduced also in the deep high-concentration n-type impurity diffusion regions 31.

An unreacted cobalt film is removed from over the semiconductor substrate 20. The first embodiment is so configured that a cobalt silicide film 33 is formed. In place of the cobalt silicide film 33, for example, a nickel silicide film or a titanium silicide film may be formed.

Subsequently, as illustrated in FIG. 7, a silicon nitride film 34 and a silicon oxide film 35 to be an interlayer insulating film are formed over the principal surface of the semiconductor substrate 20. The silicon nitride film 34 can be formed using, for example, CVD and the silicon oxide film 35 can be formed using CVD using, for example, TEOS (tetra ethyl ortho silicate) as material. Thereafter, the surface of the silicon oxide film 35 is planarized using, for example, CMP (Chemical Mechanical Polishing).

Subsequently, using photolithography and etching, a contact hole CNT penetrating the silicon nitride film 34 and the silicon oxide film 35 is formed. Multiple contact holes CNT are formed. Specifically, contact holes CNT that reach the source region and drain region of a transfer MISFET (n-channel MISFET) and contact holes CNT that reach the substrate potential supply section Lp1 are formed.

Then a titanium/titanium nitride film is formed over the silicon oxide film 35 including the bottom faces and inner walls of the contact holes CNT. The titanium/titanium nitride film is comprised of a laminated film of a titanium film and a titanium nitride film and is formed using, for example, sputtering. The titanium/titanium nitride film has so-called barrier properties and prevents, for example, tungsten as the material of a film to be filled at the subsequent step from being diffused into silicon.

Subsequently, a tungsten film is formed over the entire principal surface of the semiconductor substrate 20 so that the contact holes CNT are filled therewith. The tungsten film can be formed using, for example, CVD. Then unnecessary titanium/titanium nitride film and tungsten film formed over the silicon oxide film 35 are removed by, for example, CMP. Thus plugs PLG can be formed.

Subsequently, a titanium/titanium nitride film, an aluminum film containing copper, and a titanium/titanium nitride film are successively formed over the silicon oxide film 35 and the plugs PLG though not shown in the drawing. These films can be formed using, for example, sputtering. Subsequently, using photolithography and etching, these films are patterned to form a wiring. Further, a wiring is formed over the wiring to form multilayer interconnection. Thus an integrated circuit including the SRAM can be formed over the semiconductor substrate 20. In the description of the manufacturing process for the semiconductor device in the first embodiment, transfer MISFETs (n-channel MISFETs) comprising the SRAM are illustrated. The other MISFETs (drive MISFETs and load MISFETs) comprising the SRAM are formed by basically the same process and the other circuits (logic circuit and the like) comprising the LCD driver are also formed by basically the same process.

Figure 21:
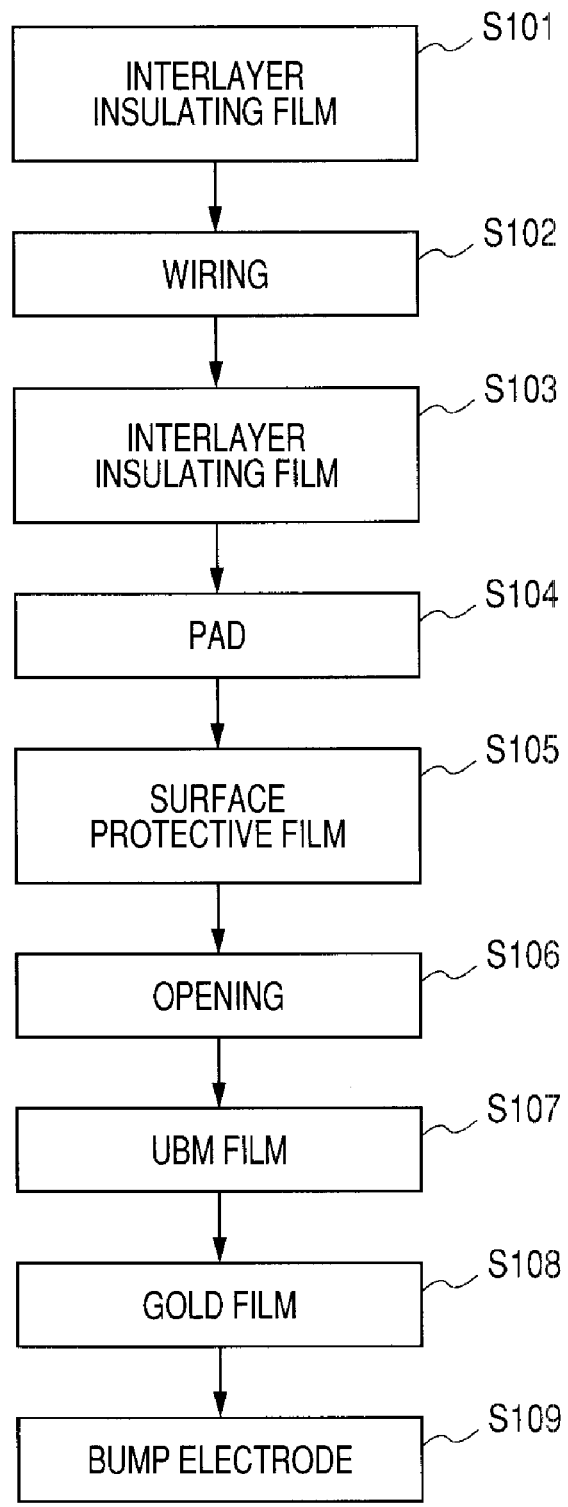
FIG. 21 is a flowchart illustrating a manufacturing process for an LCD driver.

Description will be given to the steps of the manufacturing process subsequent to the formation of the integrated circuit including the SRAM with reference to the flowchart in FIG. 21. First, an interlayer insulating film is formed over the semiconductor element including the SRAM formed in the semiconductor substrate. The interlayer insulating film is comprised of a laminated film of multiple silicon oxide films. Some of the silicon oxide films can be formed using, for example, plasma CVD (Chemical Vapor Deposition). The others of the silicon oxide films are formed using TEOS as material (S101). A conductor film is formed over the interlayer insulating film. Using photolithography and etching, the conductor film is patterned to form a wiring (S102). The conductor film is formed of, for example, an aluminum film and can be formed using, for example, sputtering. It has been described above that the conductor film is formed of an aluminum film. In reality, however, the conductor film is so structured that an aluminum film is sandwiched by titanium/titanium nitride films from above and below. Multilayer interconnection can be formed by repeating these interlayer insulating film formation step and wiring formation step.

After an interlayer insulating film is subsequently formed over the wiring (S103), pads are formed in the uppermost wiring layer (S104). The pads are formed by patterning the conductor film as the wiring is. Thereafter, a silicon oxide film covering the uppermost wiring layer (pads) is formed. The silicon oxide film can be formed by, for example, plasma CVD. Thereafter, a silicon oxide film using TEOS as material is further formed over the above silicon oxide film, and a silicon nitride film is formed over this silicon oxide film. The silicon nitride film can be formed using, for example, CVD. Thus a surface protective film covering the pads formed in the uppermost wiring layer can be formed (S105). In the first embodiment, the surface protective film is formed of two silicon oxide films and one silicon nitride film. The surface protective film is provided to protect the semiconductor chip against mechanical stress and the ingress of impurities. For this reason, the surface protective film is required to have mechanical strength and barrier properties against contaminating impurities, such as movable ions.

Subsequently, openings are formed in the surface protective film using photolithography and etching (S106). These openings are formed over the pads and expose the surfaces of the pads.

Subsequently, an UBM (Under Bump Metal) film is formed over the surface protective film including the interior of the openings (S107). The UBM film can be formed using, for example, sputtering and is formed of a single-layer film or a laminated film of, for example, a titanium film, a nickel film, a palladium film, a titanium-tungsten alloy film, a titanium nitride film, or a gold film. The UBM film has a function of enhancing the adhesion between bump electrodes and the pads and the surface protective film. In addition, the UBM film has a barrier function and suppresses or prevents the migration of the metallic elements of the gold film formed at the subsequent step to a wiring or the like and the converse migration of the metallic elements of a wiring or the like to the gold film side.

Thereafter, a resist film is applied to the UBM film and then the resist film is subjected to the exposure and development processing and is patterned. This patterning is carried out so that no resist film is left in the bump electrode formation regions. Using plating, a gold film is formed over the exposed UBM film (S108). At this time, the gold film is not only formed over the surface protective film (silicon nitride film) but also filled in the openings. Plugs are formed by filling the openings with the gold film.

The patterned resist film and the UBM film covered with the resist film are removed to form bump electrodes comprised of the gold film and the UBM film (S109). Thereafter, the semiconductor substrate is diced, and thus segmented semiconductor chips can be obtained. (Refer to FIG. 1.)

Figure 22:
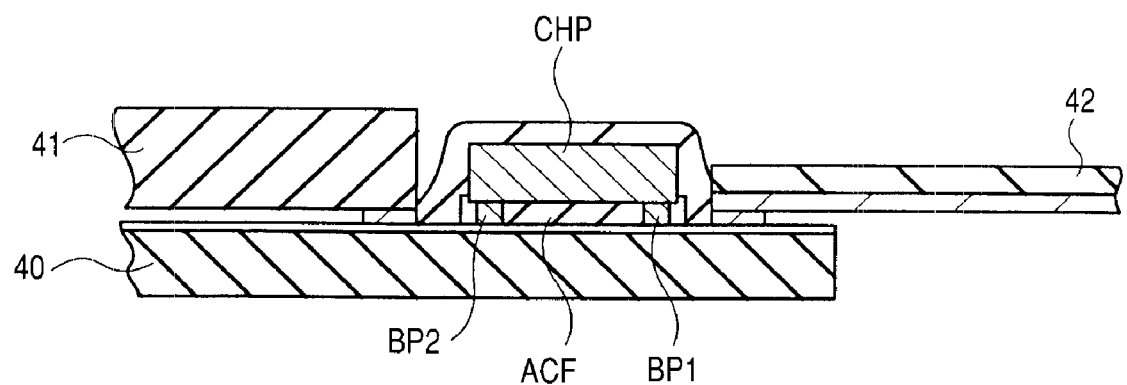
FIG. 22 is a sectional view illustrating how a semiconductor chip in a first embodiment is mounted over a glass substrate.

Subsequently, the semiconductor chip formed as mentioned above is mounted over a mounting board by bonding. FIG. 22 illustrates how a semiconductor chip CHP is mounted over a glass substrate 40 (COG: Chip On Glass). As illustrated in FIG. 22, the glass substrate 40 is mounted with a glass substrate 41, which forms the display section of the LCD. The semiconductor chip CHP as an LCD driver is mounted over the glass substrate 40 in proximity to the display section of the LCD. In the semiconductor chip CHP, there are formed bump electrodes BP1, BP2, and the bump electrodes BP1, BP2 and terminals formed over the glass substrate 40 are coupled with each other through an anisotropic conductive film ACF. The glass substrate 40 and a flexible printed board (flexible printed circuit) 42 are also coupled with each other through the anisotropic conductive film ACF. In the semiconductor chip CHP mounted over the glass substrate 40 as mentioned above, the bump electrodes are coupled as follows: the bump electrodes BP2 for output are electrically coupled to the display section of the LCD and the bump electrodes BP1 for input are coupled to the flexible printed board 42.

Figure 23:
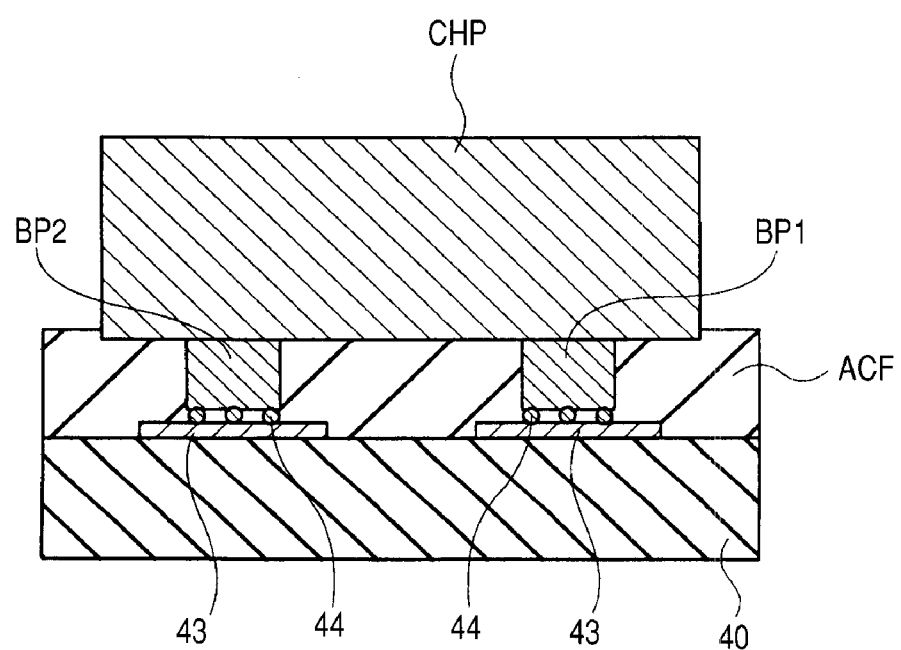

FIG. 23 is an enlarged view of the area where the semiconductor chip CHP is mounted over the glass substrate 40. In FIG. 23, terminals 43 are formed over the glass substrate 40 and the bump electrodes BP1, BP2 formed over the semiconductor chip CHP are electrically coupled to these terminals 43. The bump electrodes BP1, BP2 and the terminals 43 are not in direct contact with each other but they are coupled with each other through the anisotropic conductive film ACF. The anisotropic conductive film ACF is obtained by mixing fine conductive metal particles 44 with thermosetting resin and molding the mixture into a film. Each metal particle 44 is comprised of a sphere, 3 μm to 5 μm in diameter, in which mainly a nickel layer and a gold plating layer are formed from inside and an insulating layer is lapped over the outermost part.

When the semiconductor chip CHP is mounted over the glass substrate 40, the anisotropic conductive film ACF is sandwiched between the terminals 43 of the glass substrate 40 and the bump electrodes BP1, BP2 of the semiconductor chip CHP. When heat is applied by a heater or the like to apply pressure to the semiconductor chip CHP, the pressure is applied only to the areas corresponding to the bump electrodes BP1, BP2. Thus the metal particles 44 dispersed in the anisotropic conductive film ACF are brought into contact with one another and overlap with one another, and the metal particles 44 are pressed against one another. As a result, a conduction path is formed in the anisotropic conductive film ACF through metal particles 44. The metal particles 44 positioned in the parts of the anisotropic conductive film ACF where pressure is not applied hold the insulating layer formed over the surfaces of the metal particles 44. Therefore, insulation is ensured between the bump electrodes BP1 arranged side by side and between the bump electrodes BP2 arranged side by side. For the reason, the following advantage is brought: even when the spacing between bump electrodes BP1 or bump electrodes BP2 is narrow, the semiconductor chip CHP can be mounted over the glass substrate 40 without causing short-circuiting there.

Figure 24:
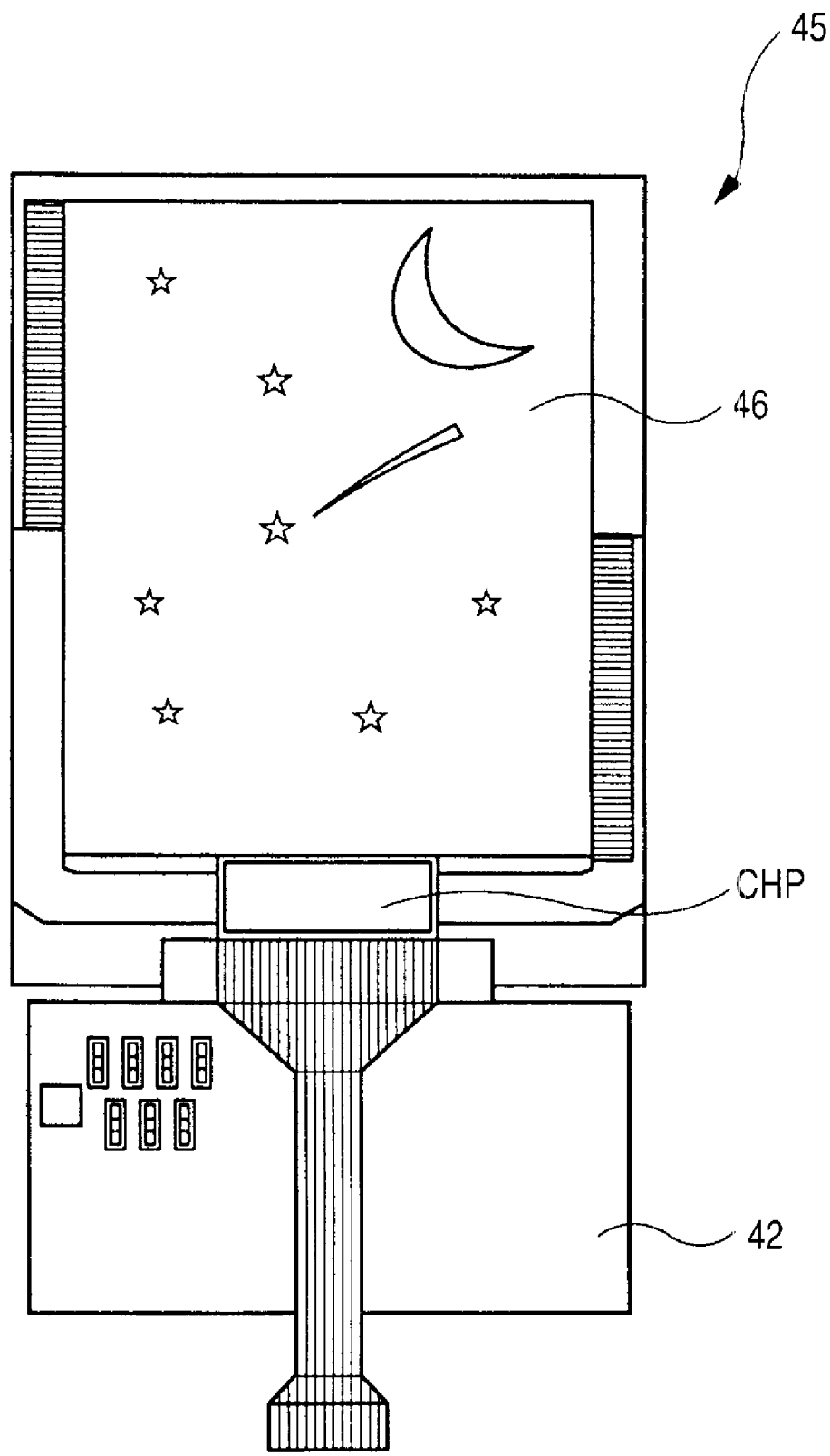
FIG. 24 is a drawing illustrating the main configuration of a liquid crystal display device.

FIG. 24 illustrates the overall configuration of the LCD (liquid crystal display device 45). As illustrated in FIG. 24, the display section 46 of the LCD is formed over the glass substrate and images are displayed in this display section 46. The semiconductor chip CHP as an LCD driver is mounted over the glass substrate in proximity to the display section 46. The flexible printed board 42 is mounted in proximity to the semiconductor chip CHP, and the semiconductor chip CHP as a driver is mounted between the flexible printed board 42 and the display section 46 of the LCD. Thus the semiconductor chip CHP can be mounted over the glass substrate. The semiconductor chip CHP as an LCD driver can be mounted in the liquid crystal display device 45 as mentioned above.

Second Embodiment

In the description of the first embodiment, a case where the width of active areas is made larger at the terminal sections than at the parts (central parts) back from the terminal sections as illustrated in FIG. 4 and FIG. 5 has been taken as an example. That is, the terminal sections are formed in an L shape (FIG. 4) or in a hammerhead shape (FIG. 5). In the description of the second embodiment, the following case will be taken as an example: a case where to make the width of active areas larger at the terminal sections than at parts (central parts) back from the terminal sections, the terminal sections of the active areas as adjoining n-type semiconductor regions are coupled with each other.

Figure 25:
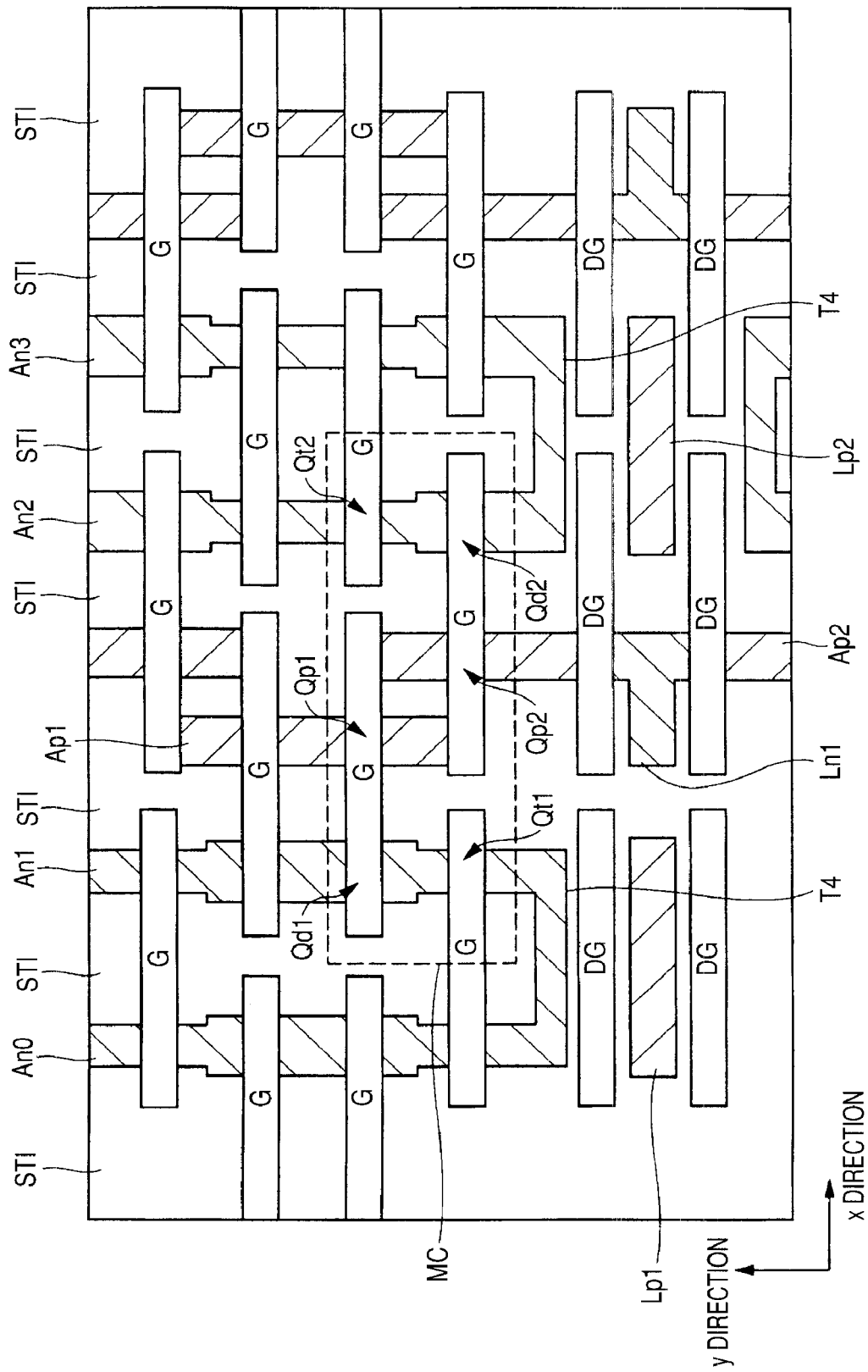
FIG. 25 is a drawing illustrating the planar configuration of SRAM in a second embodiment.

FIG. 25 illustrates the planar configuration of SRAM in the second embodiment. It can be seen from FIG. 25 that the active areas An0, An1 in n-channel MISFET formation regions are coupled with each other at their terminal sections T4. With this configuration, it is possible to suppress stress concentration from an element isolation region STI on the terminal sections that are prone to be machined into a tapered shape in the process of active area formation. That is, the following can be implemented by increasing the width of the terminal sections T4 with increase in the degree of coupling between the adjoining active areas An0, An1: the terminal sections T4 can be prevented from being machined into a tapered shape when the active areas An0, An1 are machined. That is, stress received from an element isolation region STI can be dispersed by widening the terminal sections T4 to the extent that the active areas An0, An1 are coupled together. For this reason, it is possible to reduce stress from an element isolation region STI at the terminal sections T4 and suppress the growth of a crystal defect from the terminal sections T4. As described up to this point, one feature of the second embodiment is that the following measure is taken on the precondition that the active areas An0, An1, An2, An3 in n-channel MISFET formation regions are all configured in the isolated structure: the terminal section T4 of the active area An0 and that of the active area An1 are coupled together.

Similarly, the terminal sections T4 of the adjoining active area An2 and active area An3 are coupled together.

Also in the second embodiment, the width of active areas is made larger at the terminal sections than at parts (central parts) back from the terminal sections as in the first embodiment. Therefore, the same effect as in the first embodiment can be obtained. The method of manufacturing the SRAM in the second embodiment is basically the same as in the first embodiment. The terminal sections of adjoining active areas can be so formed that they are coupled with each other by varying the patterning method in the process of element isolation region formation.

Third Embodiment

In the first embodiment and the second embodiment, the fraction defective of semiconductor devices can be reduced by suppressing a crystal defect produced in an active area. In relation to the third embodiment, description will be given to a technical idea of obtaining the same effect by a different means from those in the first embodiment and the second embodiment.

Figure 26:
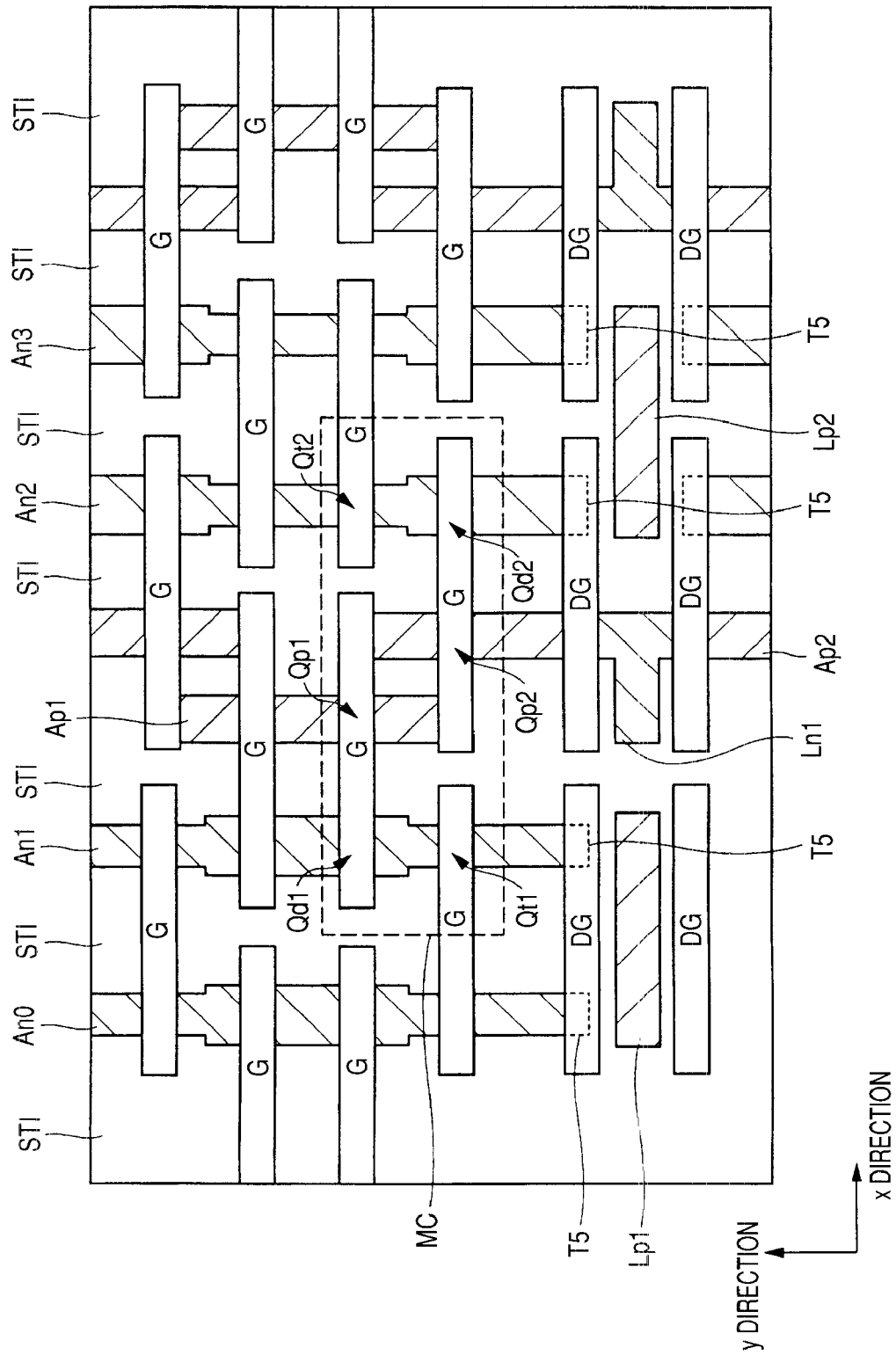
FIG. 26 is a drawing illustrating the planar configuration of SRAM in a third embodiment.
Figure 27:
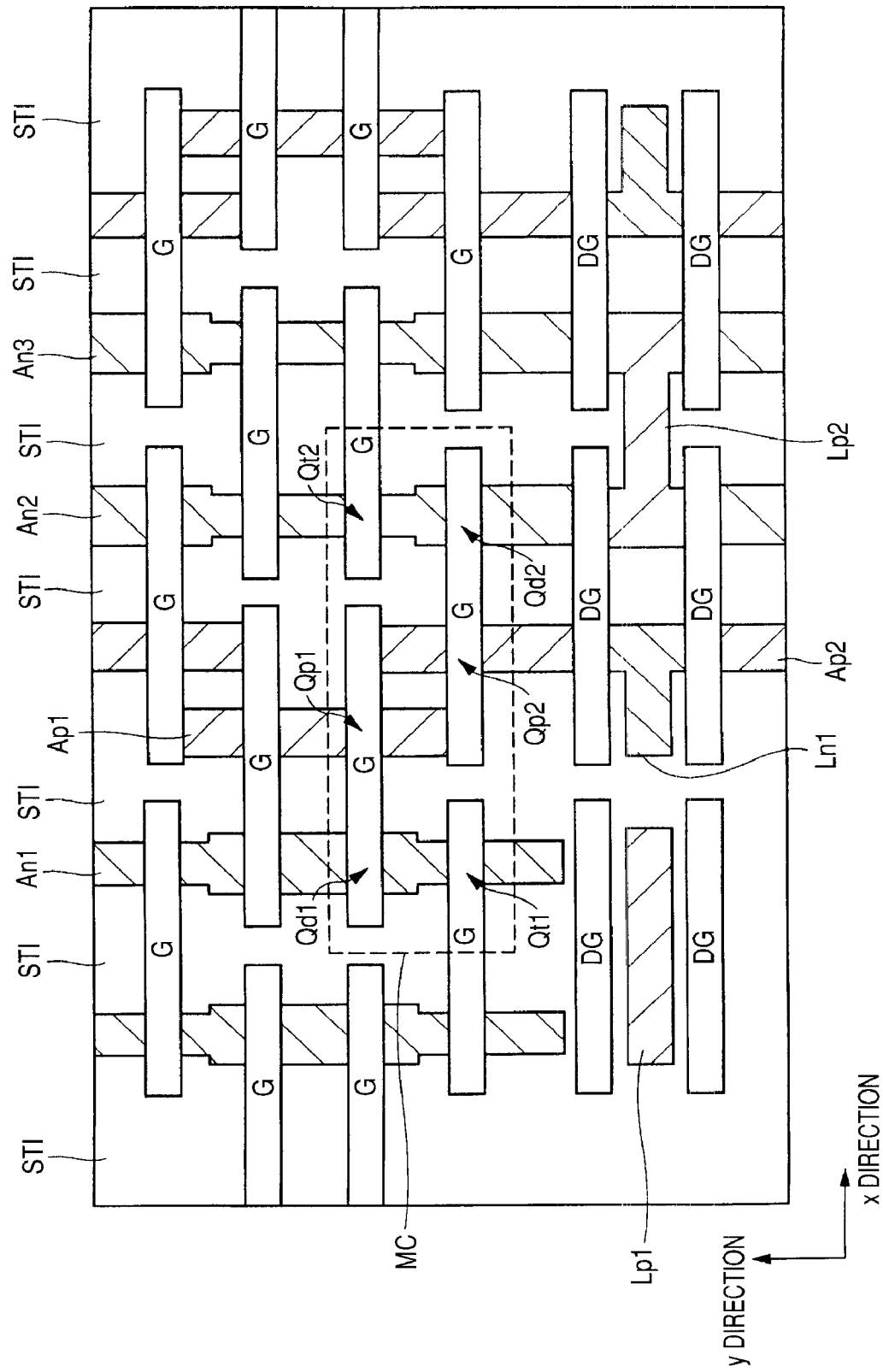
FIG. 27 is a drawing illustrating the planar configuration of SRAM reviewed by the present inventors.

FIG. 26 illustrates the planar configuration of SRAM in the third embodiment. As illustrated in FIG. 26, one of the features of the third embodiment is that the terminal sections T5 of the active areas An0, An1, An2, An3 are covered with a dummy electrode DG on the precondition that the following measure is taken: the isolated structure is adopted to isolate the active areas An0, An1, An2, An3 in n-channel MISFET formation regions from the substrate potential supply sections Lp1, Lp2. The terminal sections T5 of the active areas An0, An1, An2, An3 and dummy electrodes DG are so disposed that they overlap with each other on a plane.

With this configuration, it is possible to suppress the production of a crystal defect starting at the terminal sections T5 of the active areas An0, An1, An2, An3. The reason for this will be described. With the isolated structure, the active areas An0, An1, An2, An3 in n-channel MISFET formation regions are isolated from the substrate potential supply sections Lp1, Lp2. At this time, usually, the terminal sections of the active areas An0, An1, An2, An3 are not covered with a dummy electrode DG. For this reason, the following takes place when the source regions and drain regions of transfer MISFETs and drive MISFETs comprising SRAM are formed: an n-type impurity, such as phosphorus and arsenic, is implanted in the terminal sections of the active areas An0, An1, An2, An3 in n-channel MISFET formation regions. If an impurity is implanted in the terminal sections of the active areas An0, An1, An2, An3, it is supposed that a crystal defect or a dislocation loop is prone to be produced because of damage caused during the implantation. Further, if an impurity is involved in even a high-temperature annealing step for diffusing impurities, it is supposed that a crystal defect or a dislocation loop causing a crystal defect is prone to be produced.

This viewpoint was found by the present inventors as the result of consideration of the fact that crystal defects were few in the active area Ap1 in a p-channel MISFET formation region. That is, the active area Ap1 in a p-channel MISFET formation region is of the isolated structure as the active areas in n-channel MISFET formation regions are, as illustrated in FIG. 26; nevertheless, crystal defects are few in the active area Ap1. The present inventors considered this point. As the result of the consideration, the present inventors thought that the difference between the active area Ap1 in a p-channel MISFET formation region of the isolated structure and the active areas in n-channel MISFET formation regions of the isolated structure was as follows: the active area Ap1 in a p-channel MISFET formation region is so structured that the terminal section is covered with a gate electrode G; and in the active areas in n-channel MISFET formation regions, meanwhile, the terminal sections are not covered with a gate electrode G.

As described in relation to the first embodiment, the impurity implanted in the active area Ap1 in a p-channel MISFET formation region is boron or boron fluoride. In the area, stress required for the growth of a dislocation is increased as compared with cases where the impurity implanted in an active area is an n-type impurity, such as phosphorus and arsenic. This is suspected to be one reason for few crystal defects. Further, the present inventors noted that the active area Ap1 in a p-channel MISFET formation region was so structured that the terminal section was covered with a gate electrode G. As a result, the present inventors found that when an impurity is implanted in the terminal section of an active area, a crystal defect or a dislocation loop is prone to be produced due to damage caused during the implantation. Further, the present inventors found that if an impurity is involved in even a high-temperature annealing step for diffusing impurities, a crystal defect or a dislocation loop causing a crystal defect is prone to be produced.

To cope with this, as illustrated in FIG. 26, the following configuration is adopted on the precondition that the isolated structure is used to isolate the active areas An0, An1, An2, An3 in n-channel MISFET formation regions from the substrate potential supply sections Lp1, Lp2: the terminal sections T5 of the active areas An0, An1, An2, An3 are covered with a dummy electrode DG. With this configuration, the terminal sections T5 of the active areas An0, An1, An2, An3 are covered with the dummy electrodes DG. The step of implanting an n-type impurity, such as phosphorus and arsenic, in the active areas An0, An1, An2, An3 is subsequent to the step of forming the dummy electrodes DG. When the terminal sections T5 of the active areas An0, An1, An2, An3 are covered with the dummy electrodes DG, therefore, the dummy electrodes DG function as a mask and the terminal sections T5 are not implanted with an impurity. Therefore, there is no influence of damage caused when an impurity is implanted or a high-temperature annealing step for diffusing impurities. Even though stress from an element isolation region STI is exerted, a crystal defect and a dislocation loop are less prone to be produced. When the terminal sections T5 of the active areas An0, An1, An2, An3 are covered with the dummy electrodes DG, the terminal sections T5 are not implanted with an n-type impurity, such as phosphorus and arsenic. As a result, it is supposed that the resistance against stress from the element isolation region STI is enhanced. For the foregoing reason, the following effect is obtained with the configuration of the SRAM in the third embodiment: it is possible to suppress a crystal defect produced in an active area in an n-channel MISFET formation region and thus reduce the fraction defective of semiconductor devices.

To cover the terminal sections T5 of the active areas An0, An1, An2, An3 with the dummy electrodes DG, there are two possible methods: a method of extending the terminal sections T5 to the areas directly under the dummy electrodes DG; and a method of shifting the positions where the dummy electrodes DG are formed to the positions where the terminal sections T5 are covered. Basically, either method makes it possible to cover the terminal sections. However, the following can be said in consideration of that the dummy electrodes DG are formed to evenly form gate electrodes G throughout the semiconductor substrate to ensure machining accuracy: extending the terminal sections T5 of the active areas An0, An1, An2, An3 to the areas directly under the dummy gate electrodes DG is preferable to shifting the positions of the dummy electrodes DG.

The method of manufacturing the SRAM in the second embodiment is basically the same as in the first embodiment. The SRAM can be so formed that the terminal sections of active areas are covered with dummy electrodes by varying the patterning method in the process of element isolation region formation or varying the pattern of dummy electrode formation.

Up to this point, concrete description has been given to the invention made by the present inventors based on embodiments of the invention. However, the invention is not limited to the above embodiments and can be variously modified without departing from the subject matter of the invention, needless to add.

For example, the configuration of the first embodiment or the configuration of the second embodiment can be combined with the configuration of the third embodiment. In this case, a crystal defect produced in an active area in an n-channel MISFET formation region can be further suppressed. As a result, the effect of reducing the fraction defective of semiconductor devices can be obtained.

The invention can be widely applicable to the manufacturing industry of semiconductor devices.

What is claimed is:

1. A semiconductor device including a plurality of memory cells of SRAM, comprising:
   a semiconductor substrate;
   an element isolation region formed by filling a trench formed in the semiconductor substrate with an insulating film;
   a first active area which is defined by the element isolation region, which is formed by implanting a first conductive impurity into the semiconductor substrate and which extends in a first direction so as to span two or more of said memory cells;
   a second active area which is defined by the element isolation region, and which is formed by implanting the first conductive impurity into the semiconductor substrate, and which extends in the first direction so as to span two or more of said memory cells and which is isolated from the first active region by the element isolation region;
   a plurality of first n-type MISFETs and a plurality of second n-type MISFETs formed over the first active area, wherein first gate electrodes of the first n-type MISFETs extend in a second direction perpendicular to the first direction and wherein second gate electrodes of the second n-type MISFETs extend in the second direction; and
   a plurality of third n-type MISFETs and a plurality of fourth n-type MISFETs formed over the second active area, wherein third gate electrodes of the third n-type MISFETs extend in the second direction and wherein fourth gate electrodes of the fourth n-type MISFETs extend in the second direction,
   wherein each of the memory cells includes one of the first n-type MISFETs, one of the second n-type MISFETs, one of the third n-type MISFETs, and one of the fourth n-type MISFETs,
   wherein a width in the second direction of a first terminal section of the first active area is larger than a width in the second direction of the first active area where the first and second n-type MISFETs are formed, and
   wherein a width in the second direction of a second terminal section of the second active area is larger than a width in the second direction of the second active area where the third and fourth n-type MISFETs are formed.

2. The semiconductor device according to claim 1,
   wherein the width of the first terminal section of the first active area in the second direction is largest among the widths of the first active area in the second direction, and
   wherein the width of the second terminal section of the second active area in the second direction is largest among the widths of the second active area in the second direction.

3. The semiconductor device according to claim 2,
   wherein the width of the first terminal section of the first active area in the second direction is equal to or larger than 1.5 times the width of the narrowest area of the first active area in the second direction, and
   wherein the width of the second terminal section of the second active area in the second direction is equal to or larger than 1.5 times the width of the narrowest area of the second active area in the second direction.

4. The semiconductor device according to claim 1,
   wherein the first and second active areas are implanted with nitrogen.

5. The semiconductor device according to claim 1,
   wherein the first terminal section of the first active area is bent to the second direction, and
   wherein the second terminal section of the second active area is bent to the second direction.

6. The semiconductor device according to claim 5,
   wherein the first terminal section of the first active area is in an L shape, and
   wherein the second terminal section of the second active area is in an L shape.

7. The semiconductor device according to claim 1,
   wherein a plurality of first p-type MISFETs and a plurality of second p-type MISFETs are arranged between the first active area and the second active area, and
   wherein each of the memory cells further includes one of the first p-type MISFETs and one of the second p-type MISFETs.

8. The semiconductor device according to claim 7,
   wherein a first substrate potential supply section is formed in the semiconductor substrate and is adjacent with the first terminal section in the first direction, and
   wherein a second substrate potential supply section is formed in the semiconductor substrate and is adjacent with the second terminal section in the first direction.

9. The semiconductor device according to claim 1,
   wherein a first substrate potential supply section is formed in the semiconductor substrate and is adjacent with the first terminal section in the first direction, and
   wherein a second substrate potential supply section is formed in the semiconductor substrate and is adjacent with the second terminal section in the first direction.

10. The semiconductor device according to claim 1,
    wherein the second terminal section of one memory cell is coupled with the first terminal of the other memory cell which is adjacent in the second direction.

11. The semiconductor device according to claim 10,
    wherein a plurality of first p-type MISFETs and a plurality of second p-type MISFETs are arranged between the first active area and the second active area, and
    wherein each of the memory cells further includes one of the first p-type MISFETs and one of the second p-type MISFETs.

12. The semiconductor device according to claim 11,
    wherein a first substrate potential supply section is formed in the semiconductor substrate and is adjacent with the first terminal section in the first direction, and wherein a second substrate potential supply section is formed in the semiconductor substrate and is adjacent with the second terminal section in the first direction.

13. The semiconductor device according to claim 10, wherein a first substrate potential supply section is formed in the semiconductor substrate and is adjacent with the first terminal section in the first direction, and wherein a second substrate potential supply section is formed in the semiconductor substrate and is adjacent with the second terminal section in the first direction.

14. A semiconductor device including a plurality of memory cells of SRAM, comprising:

a semiconductor substrate;

an element isolation region formed by filling a trench formed in the semiconductor substrate with an insulating film;

a first active region which is defined by the element isolation region, which is formed by implanting a first conductive impurity into the semiconductor substrate and which extends in a first direction so as to span two or more of said memory cells;

a second active region which is defined by the element isolation region, and which is formed by implanting the first conductive impurity into the semiconductor substrate, and which extends in the first direction so as to span two or more of said memory cells and which is isolated from the first active region by the element isolation region;

a plurality of first n-type MISFETs and a plurality of second n-type MISFETs formed over the first active region, wherein first gate electrodes of the first n-type MISFETs extend in a second direction perpendicular to the first direction and wherein second gate electrodes of the second n-type MISFETs extend in the second direction; and a plurality of third n-type MISFETs and a plurality of fourth n-type MISFETs formed over the second active region, wherein third gate electrodes of the third n-type MISFETs extend in the second direction and wherein fourth gate electrodes of the fourth n-type MISFETs extend in the second direction, wherein each of the memory cells includes one of the first n-type MISFETs, one of the second n-type MISFETs, one of the third n-type MISFETs, and one of the fourth n-type MISFETs, wherein the semiconductor device further comprises first and second dummy electrodes formed in the same layer as the first, second, third, and fourth gate electrodes and extending in the second direction, wherein the first dummy electrode overlaps with the first terminal section of the first active area on a plane, and wherein the second dummy electrode overlaps with the second terminal section of the second active area on a plane.

15. The semiconductor device according to claim 14, wherein a plurality of first p-type MISFETs and a plurality of second p-type MISFETs are arranged between the first active region and the second active region, and wherein each of the memory cells further includes one of the first p-type MISFETs and one of the second p-type MISFETs.

16. The semiconductor device according to claim 15, wherein a first substrate potential supply section is formed in the semiconductor substrate and is adjacent with the first terminal section in the first direction, and wherein a second substrate potential supply section is formed in the semiconductor substrate and is adjacent with the second terminal section in the first direction.

17. The semiconductor device according to claim 14, wherein a first substrate potential supply section is formed in the semiconductor substrate and is adjacent with the first terminal section in the first direction, and wherein a second substrate potential supply section is formed in the semiconductor substrate and is adjacent with the second terminal section in the first direction.

18. A semiconductor device including a plurality of memory cells of SRAM, comprising:

a semiconductor substrate;

an element isolation region formed by filling a trench formed in the semiconductor substrate with an insulating film;

a first active region which is defined by the element isolation region, which is formed by implanting a first conductive impurity into the semiconductor substrate and which extends in a first direction so as to span two or more of said memory cells; and a plurality of first n-type MISFETs and a plurality of second n-type MISFETs formed over the first active region, wherein first gate electrodes of the first n-type MISFETs extend in a second direction perpendicular to the first direction and wherein second gate electrodes of the second n-type MISFETs extend in the second direction, wherein each of the memory cells includes one of the first n-type MISFETs and one of the second n-type MISFETs, and wherein a width in the second direction of a first terminal section of the first active area is larger than a width in the second direction of the first active area where the first and second n-type MISFETs are formed further comprising: a second active region which is defined by the element isolation region, and which is formed by implanting the first conductive impurity into the semiconductor substrate, and which extends in the first direction so as to span two or more of said memory cells and which is isolated from the first active region by the element isolation region; and a plurality of third n-type MISFETs and a plurality of fourth n-type MISFETs formed over the second active region, wherein third gate electrodes of the third n-type MISFETs extend in the second direction and wherein fourth gate electrodes of the fourth n-type MISFETs extend in the second direction, wherein each of the memory cells further includes one of the third n-type MISFETs and one of the fourth n-type MISFETs, and wherein a width in the second direction of a second terminal section of the second active area is larger than a width in the second direction of the second active area where the third and fourth n-type MISFETs are formed.

19. The semiconductor device according to claim 18, wherein a plurality of first p-type MISFETs and a plurality of second p-type MISFETs are arranged between the first active region and the second active region, wherein each of the memory cells further includes one of the first p-type MISFETs and one of the second p-type MISFETs, wherein a first substrate potential supply section is formed in the semiconductor substrate and is adjacent with the first terminal section in the first direction, wherein a second substrate potential supply section is formed in the semiconductor substrate and is adjacent with the second terminal section in the first direction, wherein a first substrate potential supply section is formed in the semiconductor substrate and is adjacent with the first terminal section in the first direction, wherein a second substrate potential supply section is formed in the semiconductor substrate and is adjacent with the second terminal section in the first direction, and wherein the second terminal section of one memory cell is coupled with the first terminal of the other memory cell which is adjacent in the second direction.

* * * * *